(12) United States Patent
Li et al.

(10) Patent No.: US 12,349,363 B2
(45) Date of Patent: Jul. 1, 2025

(54) FERROELECTRIC DEVICE AND METHODS OF FORMING THE SAME

(71) Applicant: TAIWAN SEMICONDUCTOR MANUFACTURING COMPANY, LTD., Hsinchu (TW)

(72) Inventors: Hung-Wei Li, Hsinchu (TW); Sai-Hooi Yeong, Hsinchu (TW); Chia-Ta Yu, New Taipei (TW); Chih-Yu Chang, New Taipei (TW); Wen-Ling Lu, Taoyuan (TW); Yu-Chien Chiu, Hsinchu (TW); Ya-Yun Cheng, Taichung (TW); Mauricio Manfrini, Hsinchu (TW); Yu-Ming Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 566 days.

(21) Appl. No.: 17/849,608

(22) Filed: Jun. 25, 2022

(65) Prior Publication Data

US 2023/0422513 A1    Dec. 28, 2023

(51) Int. Cl.
*H10B 51/30*  (2023.01)
*H10D 30/67*  (2025.01)
*H10D 30/69*  (2025.01)
*H10D 99/00*  (2025.01)

(52) U.S. Cl.
CPC ......... *H10B 51/30* (2023.02); *H10D 30/6729* (2025.01); *H10D 30/6755* (2025.01); *H10D 30/701* (2025.01); *H10D 99/00* (2025.01)

(58) Field of Classification Search
CPC .............. H10D 30/6729; H10D 30/67; H10D 30/6755; H10D 30/701; H10D 30/69; H10D 99/00; H10B 51/30; H10B 51/20; H10B 51/10
See application file for complete search history.

(56) References Cited

U.S. PATENT DOCUMENTS

| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,418,897 | B1 | 8/2016 | Ching et al. |

(Continued)

FOREIGN PATENT DOCUMENTS

TW    202109633 A    3/2021
TW    202215546 A    4/2022

*Primary Examiner* — Nikolay K Yushin
(74) *Attorney, Agent, or Firm* — NZ Carr Law Office

(57) ABSTRACT

Various embodiments of the present disclosure provide a memory device and methods of forming the same. In one embodiment, a memory device is provided. The memory device includes a gate electrode disposed in an insulating material layer, a ferroelectric dielectric layer disposed over the gate electrode, a metal oxide semiconductor layer disposed over the ferroelectric dielectric layer, a source feature disposed over the metal oxide semiconductor layer, wherein the source feature has a first dimension, and a source extension. The source extension includes a first portion disposed over the source feature, wherein the first portion has a second dimension that is greater than the first dimension. The source extension also includes a second portion extending downwardly from the first portion to an elevation that is lower than a top surface of the source feature.

20 Claims, 46 Drawing Sheets

(56) References Cited

U.S. PATENT DOCUMENTS

| | | |
|---|---|---|
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 10,818,562 B2 | 10/2020 | Lin et al. |
| 2013/0214428 A1 | 8/2013 | Maki |
| 2019/0057971 A1 | 2/2019 | Tsukamoto |
| 2021/0399137 A1 | 12/2021 | Wang et al. |

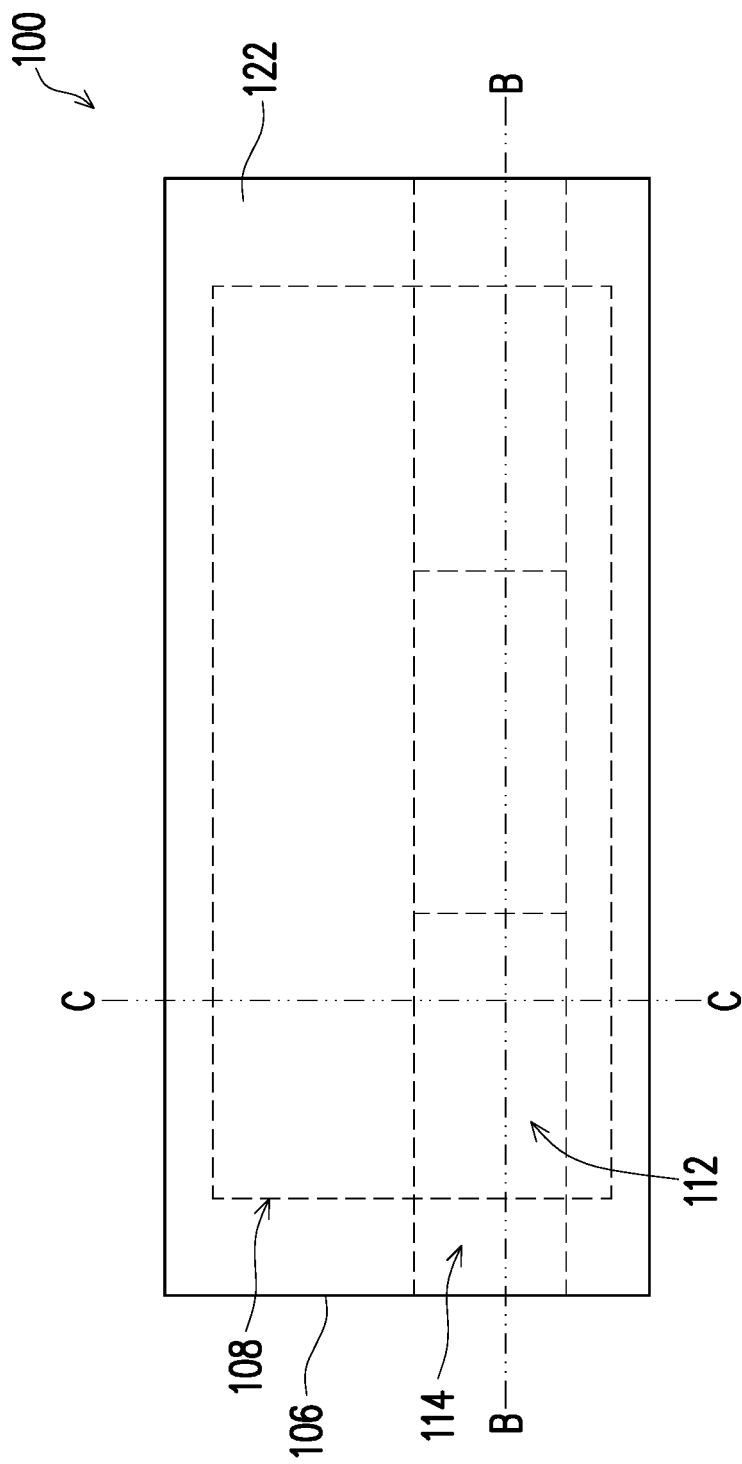

FERROELECTRIC DEVICE AND METHODS OF FORMING THE SAME

BACKGROUND

Ferroelectric field effect transistor (FeFET) is a field-effect transistor that includes a ferroelectric layer sandwiched between a gate electrode and source/drain region of a device. FeFET based devices can be used in FeFET memory—a type of single transistor binary non-volatile memory. FeFET based devices are a promising candidate for next generation non-volatile memory applications due to its low power requirements, small size, and fast write/read operation. However, FeFET based memory devices, especially ferroelectric random-access memory (FeRAM) employing oxide semiconductor as a channel material, have been found difficult to obtain a uniform electric field across the ferroelectric layer (which is required to enable proper polarization switching of the ferroelectric layer during program and erase operations). This is because the wide band gap associated with the nature of oxide semiconductors would result in the lack of sufficient hole carriers in the oxide semiconductor. When there are insufficient hole carriers in the oxide semiconductor channel, a negative voltage applied to the gate electrode can only induce low electric field in the ferroelectric layer. Therefore, a full polarization switching in the ferroelectric layer at oxide semiconductor channel region cannot be triggered, resulting in lower erase efficiency during the erase operation.

Therefore, an improved FeFET based memory device and methods of forming the same are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-11A illustrate a top view of a memory device during various stages of manufacturing, in accordance with various embodiments of this disclosure.

FIGS. 1B-11B illustrate a vertical cross-sectional view of the memory device taken along the plane B-B shown in FIGS. 1A-11A, respectively.

FIGS. 1C-11C illustrate a vertical cross-sectional view of the memory device taken along the plane C-C shown in FIGS. 1A-11A, respectively.

FIGS. 9D-11D illustrate a vertical cross-sectional view of the memory device taken along the plane D-D shown in FIGS. 9A-11A, respectively.

DETAILED DESCRIPTION

Figure 1A:
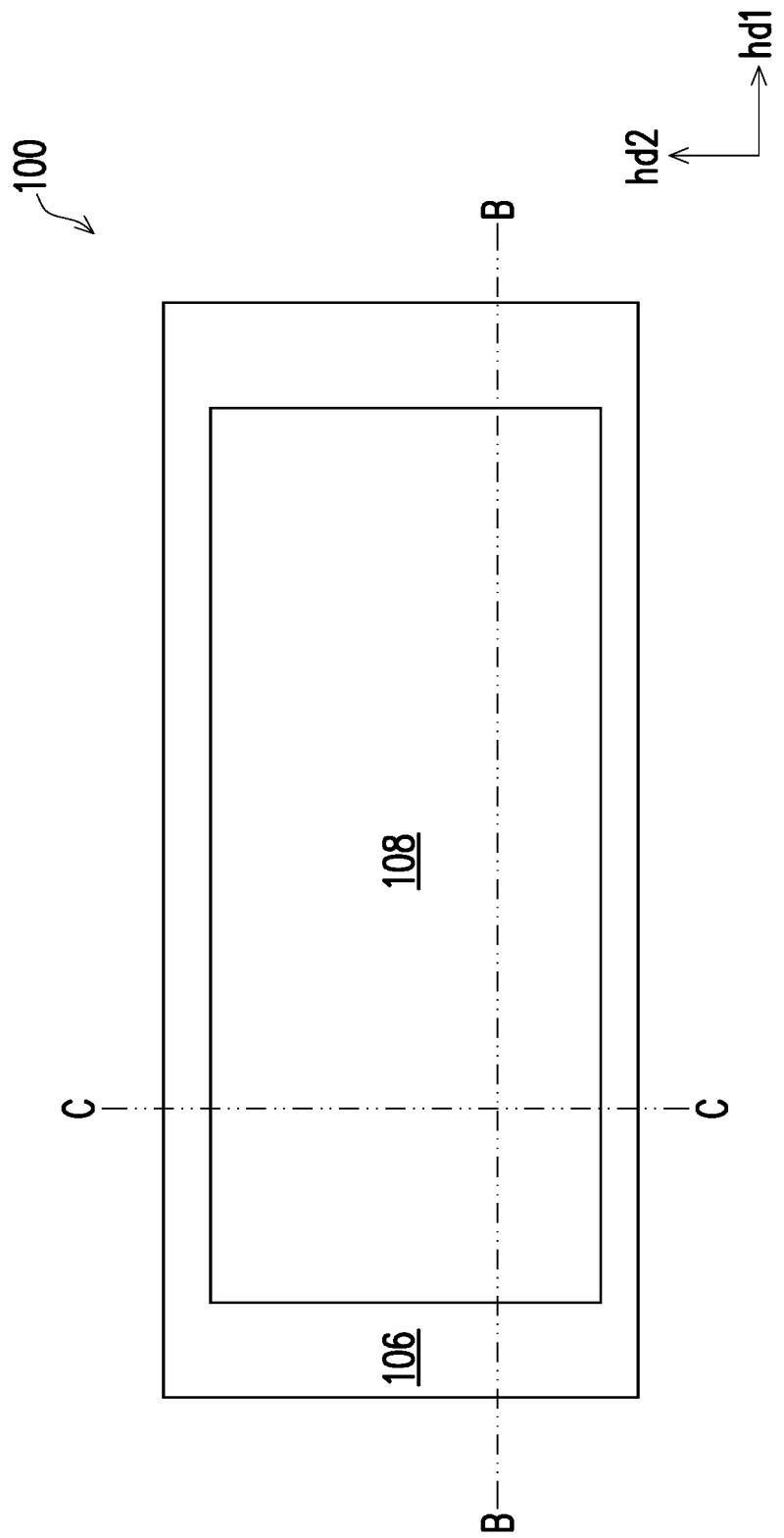

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-11A illustrate a top view of a memory device 100 during various stages of manufacturing in accordance with various embodiments of this disclosure. FIGS. 1B-11B illustrate a vertical cross-sectional view of the memory device 100 taken along the plane B-B shown in FIGS. 1A-11A, respectively. FIGS. 1C-11C illustrate a vertical cross-sectional view of the memory device 100 taken along the plane C-C shown in FIGS. 1A-11A, respectively. It is understood that additional operations can be provided before, during, and after processes shown by FIGS. 1A-15 and some of the operations described below can be replaced or eliminated, for additional embodiments of the method. The order of the operations/processes may be interchangeable.

Figure 1B:
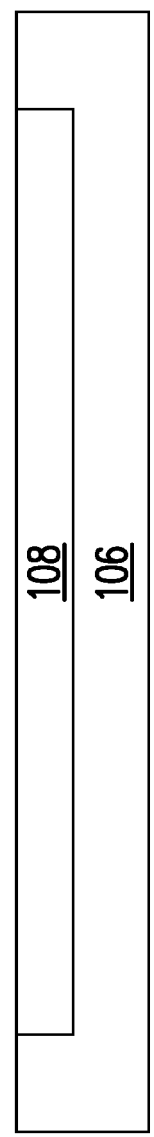
Figure 1C:
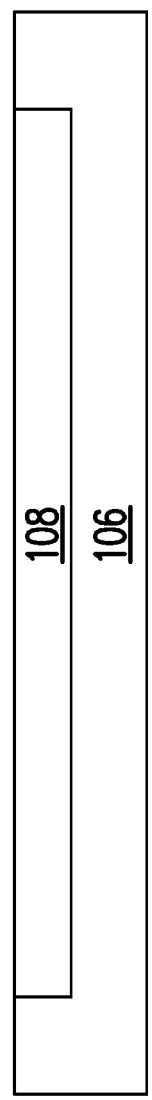

In FIGS. 1A-1C, an insulating material layer 106 and a gate electrode 108 are provided. In an exemplary embodiment shown in FIG. 1A, the plane B-B extends along a longitudinal direction of the gate electrode 108, and the plane C-C is perpendicular to the plane B-B and extending along a latitudinal direction of the gate electrode 108. It should be noted that the shape of the gate electrode 108 is shown for illustrative purposes and may vary in accordance with the layout design to have any predetermined length and width. The insulating material layer 106 may be disposed over a substrate. While not shown, the substrate may include additional material portions under the insulating material layer 106. For example, the substrate may include a commercially available semiconductor wafer including semiconductor devices (such as field-effect transistors) on an upper surface thereof. The insulating material layer 106 may include interlayer dielectric (ILD) or intermetallic dielectric (IMD) material layers having metal structures (such as metal lines and metal via structures) formed therein. Alternatively, the substrate may include an insulating substrate that includes the insulating material layer 106 as an upper portion or as an entirely thereof. Generally, the substrate has a thickness that may provide structural integrity to the devices to be subsequently formed thereupon. For example, the substrate may have a thickness in a range from about 30 microns to about 1 mm. The insulating material layer 106 may have a thickness in a range from about 100 nm to about 1 mm, which may vary depending on the configuration and the composition of the substrate. In some embodiments, the insulating material layer 106 may include a dielectric material such as silicon oxide, silicon nitride, organosilicate glass, quartz, or other suitable insulating materials, etc.

The substrate may include a combination of a crystalline semiconductor substrate (such as a commercially available crystalline silicon substrate), semiconductor devices (such as field effect transistors including crystalline semiconductor channels) located on a top surface of the crystalline semiconductor substrate, and interconnect-level dielectric material layers embedding metal interconnect structures that are electrically connected to various nodes of the semiconductor devices located on the top surface of the crystalline substrate. The insulating material layer 106 may include one or more of the interconnect-level dielectric material layers, and the structures formed in the insulating material layer 106 can be formed as a back-end-of-line (BEOL) structure.

In some embodiments, a recess region may be formed in an upper portion of the insulating material layer 106 by applying a photoresist layer (not shown) on a top surface of the insulating material layer 106, forming an opening in the photoresist layer by lithographically patterning the photoresist layer, and by anisotropically etching an upper portion of the insulating material layer 106 using the photoresist layer as an etch mask. The recess region may have a depth in a range from about 50 nm to about 500 nm, although lesser or greater depths may be used. In one embodiment, the recess region may have a rectangular shape, as shown in FIG. 1A. However, any suitable shape, such as a square or a circle, is contemplated. In one exemplary embodiment, the lateral dimension of a first side of the recess region laterally extending along a first horizontal direction hd1 may be lesser, greater, or the same as the channel length of a thin film ferroelectric field-effect transistor to be subsequently formed, and the lateral dimension of a second side of the recess region laterally extending along a second horizontal direction hd2 may be lesser, greater, or the same as the width of the channel of the thin film ferroelectric field-effect transistor to be subsequently formed. In one embodiment, the lateral dimension of the first side of the recess region along the first horizontal direction hd1 may be in a range from about 40 nm to about 1000 nm, and the lateral dimension of the second side of the recess region along the second horizontal direction hd2 may be in a range from about 20 nm to about 500 nm. In another embodiment, the first side of the recess region along the first horizontal direction hd1 may have a first lateral dimension, and the second side of the recess region along the second horizontal direction hd2 may have a second lateral dimension greater than the first lateral dimension. In such a case, the first lateral dimension and the second lateral dimension may have a ratio of (first lateral dimension:second lateral dimension) about 1:2 to about 1:5. Alternatively, the second lateral dimension and the first lateral dimension may have a ratio of (first lateral dimension:second lateral dimension) about 1:2 to about 1:5. The photoresist layer may be subsequently removed by, for example, an ashing process.

After the recess region is formed, a conductive material is deposited in the recess region. The conductive material may be a heavily doped semiconductor material (such as heavily doped poly-silicon), a transition metal, or a conductive metallic alloy of a transition metal (such as a conductive metallic nitride or a conductive metallic carbide). Excess portions of the conductive material may be removed from above the top surface of the insulating material layer 106. A remaining portion of the conductive material that fills the recess region forms the gate electrode 108. The gate electrode 108 may contact sidewalls and a recessed surface of the insulating material layer 106. In some embodiments, the gate electrode 108 may be referred to as a back gate electrode or a bottom gate electrode.

Figure 2A:
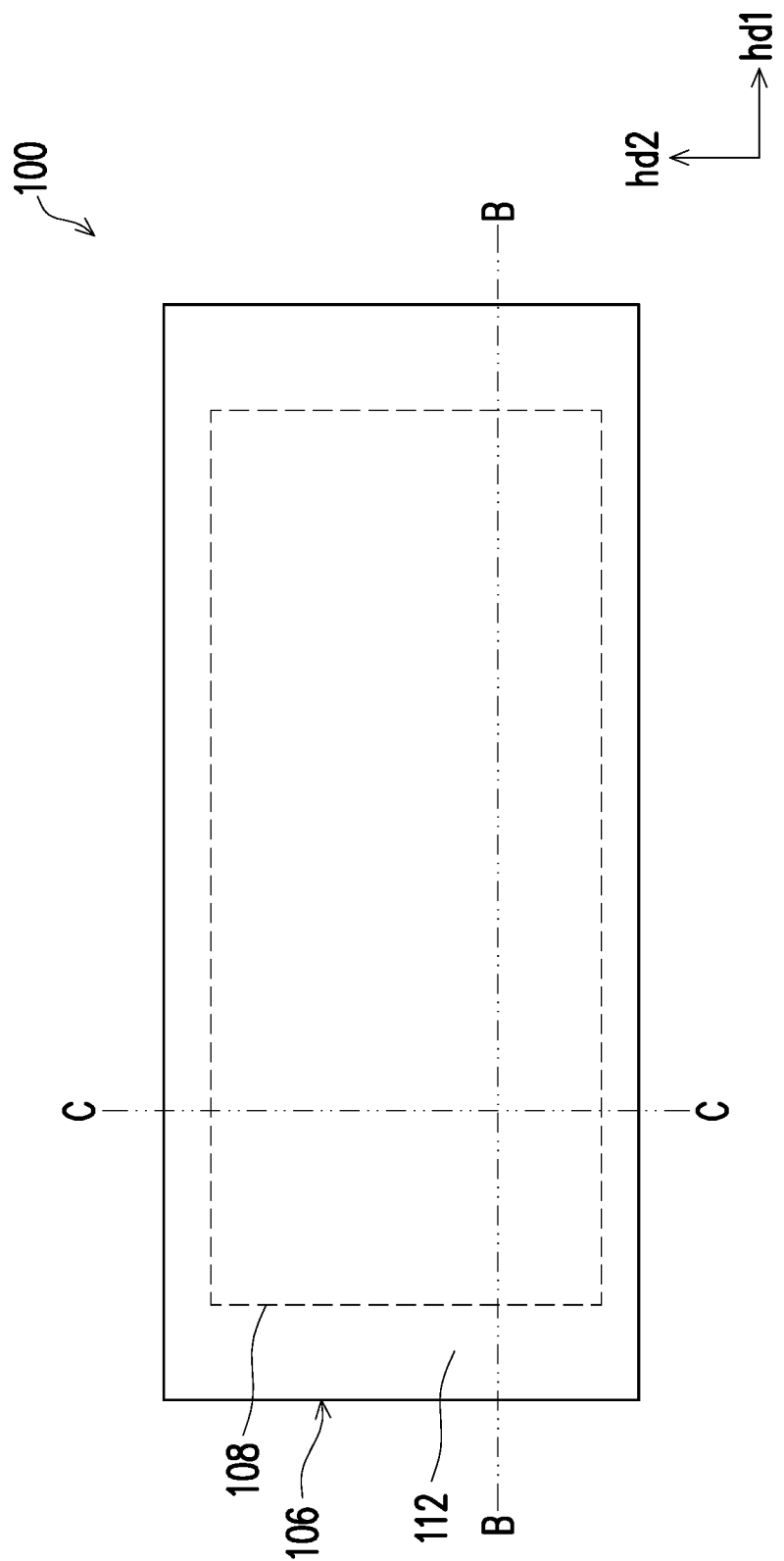
Figure 2B:
Figure 2C:
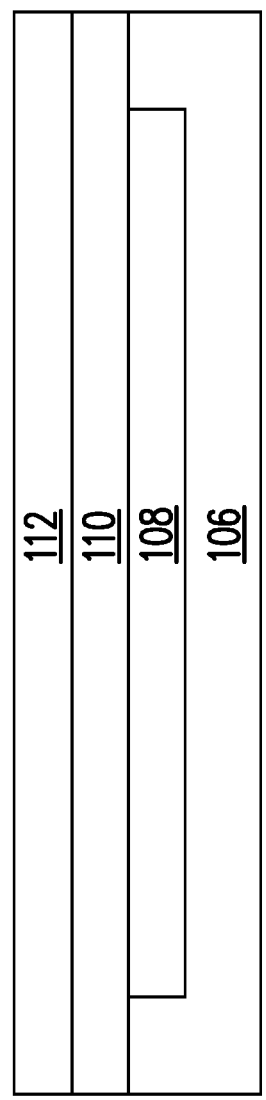

FIGS. 2A-2C show a stage after formation of a ferroelectric dielectric material and a metal oxide semiconductor layer, in accordance with some embodiments of the present disclosure. In FIGS. 2A-2C, a ferroelectric dielectric material is deposited on the top surface of the gate electrode 108 and on the top surface of the insulating material layer 106 to form a ferroelectric dielectric layer 110. Next, a metal oxide semiconductor layer 112 is deposited over the ferroelectric dielectric layer 110. The ferroelectric dielectric layer 110 may include a ferroelectric dielectric material having two stable directions for electrical polarization. The two stable directions may be the upward direction and the downward direction, or may be a set of two opposite directions having a tilt angle with respect to the vertical direction. The ferroelectric dielectric material of the ferroelectric dielectric layer 110 may include, but is not limited to, hafnium or zirconium oxide-based dielectrics, barium titanate, colemanite, bismuth titanate, europium barium titanate, ferroelectric polymer, germanium telluride, langbeinite, lead scandium tantalate, lead titanate, lead zirconate titanate, lithium niobate, polyvinylidene fluoride, potassium niobate, potassium sodium tartrate, potassium titanyl phosphate, sodium bismuth titanate, lithium tantalate, lead lanthanum titanate, lead lanthanum zirconate titanate, ammonium dihydrogen phosphate, potassium dihydrogen phosphate, and other suitable ferroelectric dielectric materials. The ferroelectric dielectric layer 110 may be deposited by a physical vapor deposition (PVD) process or any suitable deposition technique. The thickness of the ferroelectric dielectric layer 110 may be in a range from about 2 nm to about 30 nm, such as from about 4 nm to about 15 nm, although lesser or greater thickness may be used. The gate electrode 108 may contact a first portion of the insulating material layer 106, and the ferroelectric dielectric layer 110 may contact a second portion of the insulating material layer 106.

The metal oxide semiconductor layer 112 may include a metal oxide semiconductor material such as indium gallium zinc oxide (IGZO), doped zinc oxide, doped indium oxide, doped cadmium oxide with a high level of doping, or other suitable metal oxide semiconductor materials. The metal oxide semiconductor layer 112 may be deposited by a PVD process, ALD, PECVD, MBD, or any suitable deposition technique. In cases where the metal oxide semiconductor layer 112 is doped, the dopant concentration in the metal oxide semiconductor layer 112 may be in a range from $1 \times 10^{12}/cm^3$ to about $1 \times 10^{18}/cm^3$, although greater or lesser dopant concentrations may also be used. The metal oxide semiconductor layer 112 may have a thickness in a range from about 10 nm to about 100 nm, which may vary depending on the application.

Figure 3A:
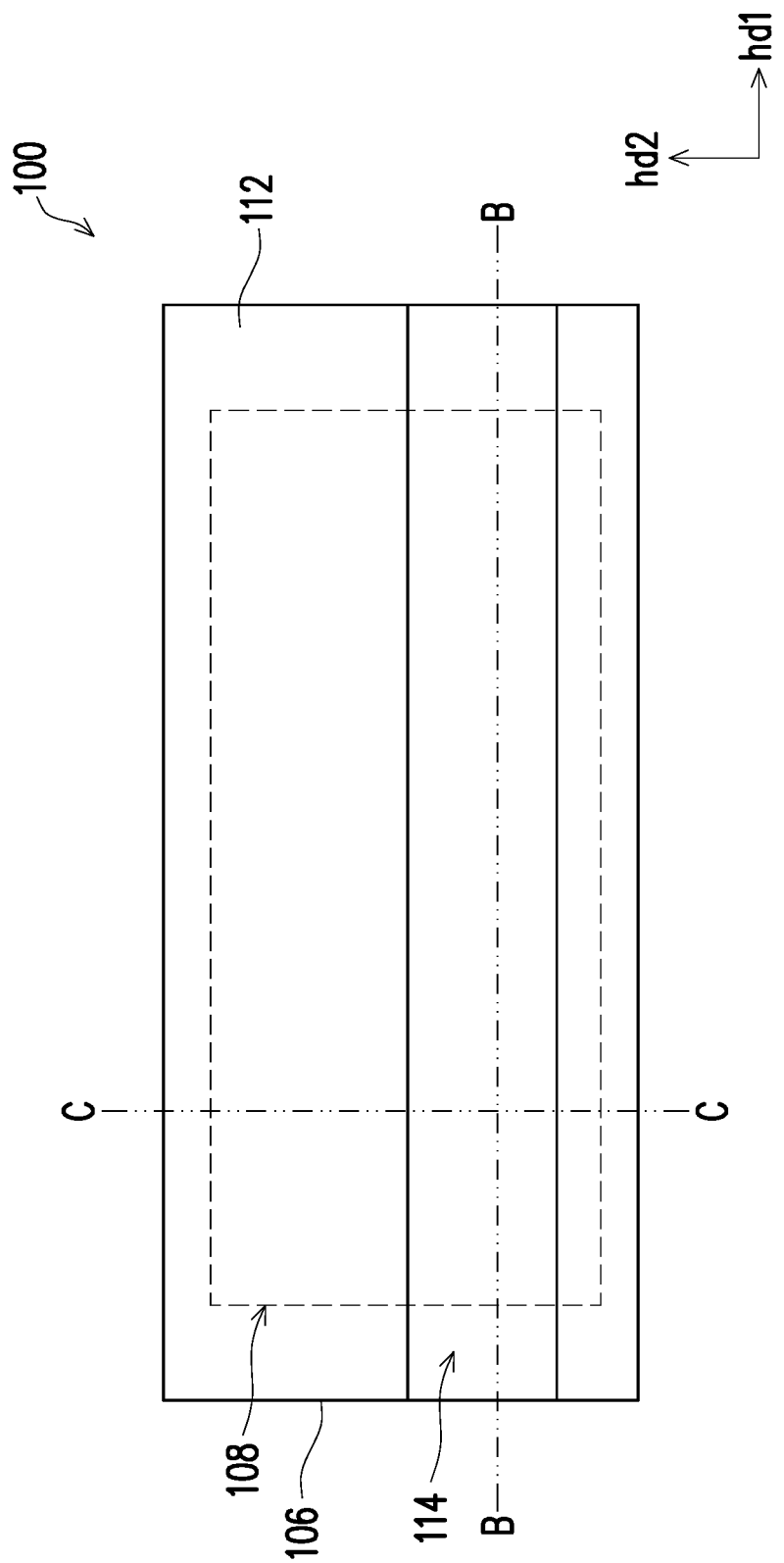
Figure 3B:
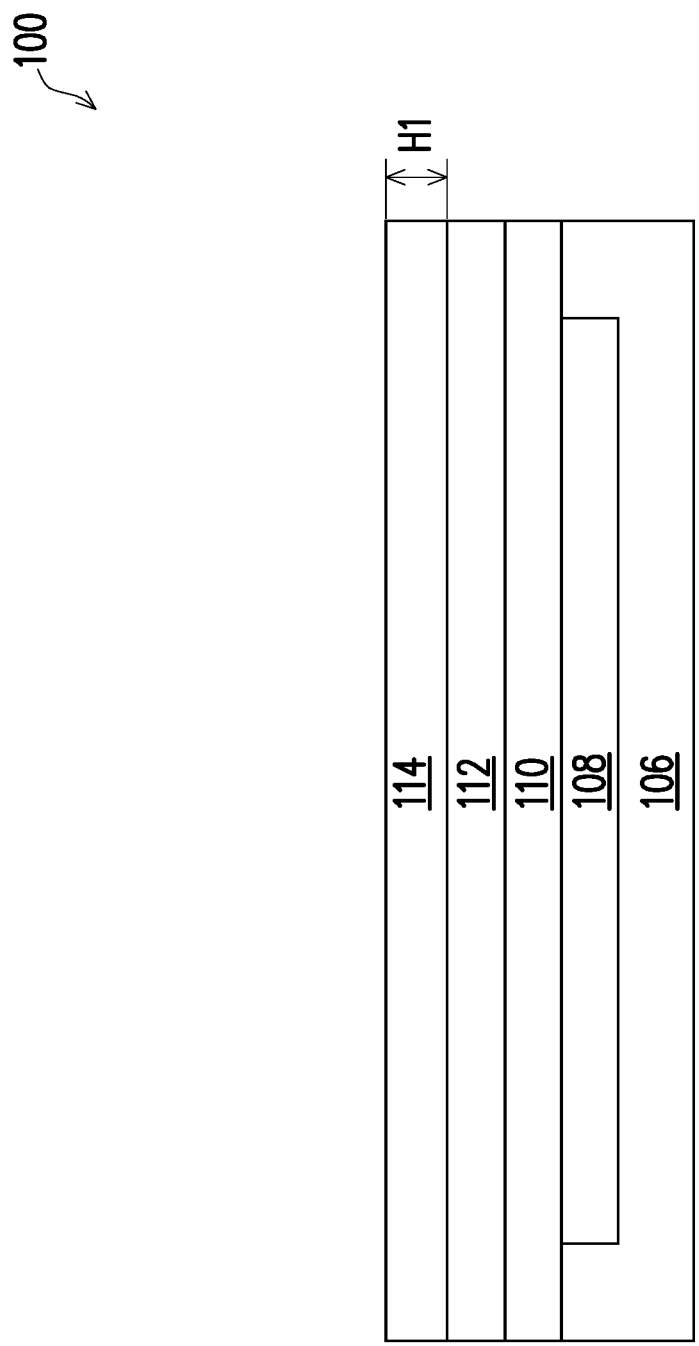
Figure 3C:
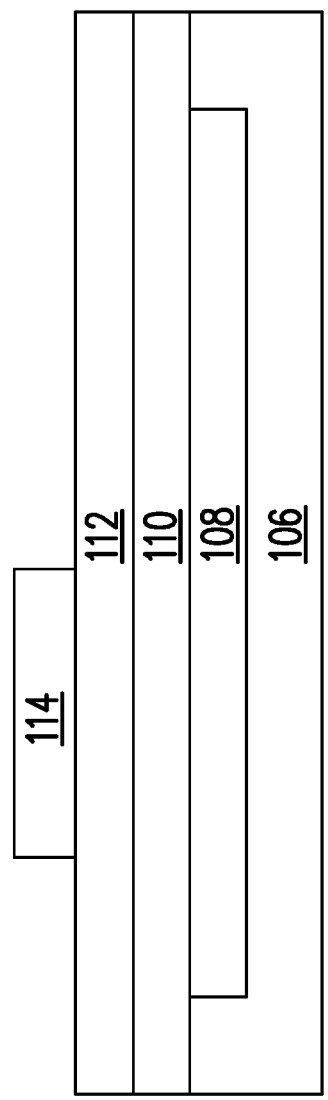

FIGS. 3A-3C show a stage after formation of a high-K dielectric layer 114, in accordance with some embodiments of the present disclosure. The high-K dielectric layer 114 may be deposited over the metal oxide semiconductor layer 112. In some embodiments, the high-K dielectric layer 114 is formed to cover a rectangular area that straddles over the area of the gate electrode 108 (represented by a dotted line). The high-K dielectric layer 114 may be formed by first depositing a continuous layer of the high-K dielectric material on the metal oxide semiconductor layer 112. Then, a patterned photoresist layer (not shown) may be applied over the continuous layer of the high-K dielectric material so that portions of the high-K dielectric layer 114 are exposed. An etch process is then performed to remove a portion of the continuous layer of the high-K dielectric material not covered by the patterned photoresist layer. The etch process uses an etchant that is selective to the high-K dielectric material but not the metal oxide semiconductor layer 112. The photoresist layer is subsequently removed, leaving the high-K dielectric layer 114 on the metal oxide semiconductor layer 112. The formation of the high-K dielectric layer 114 separates a subsequently formed source extension (e.g., source extension 138 in FIG. 11B) from contacting the metal oxide semiconductor layer 112 while help maintaining a proper channel length between a subsequent source feature and a subsequent drain feature. The location where the high-K dielectric layer 114 is formed generally defines a boundary of a channel region to be formed between subsequent source/drain (S/D) regions.

The high-K dielectric layer 114 may have a K value greater than about 4.0. In some embodiments, the high-K dielectric layer 114 has a K value greater than about 7.0, and may include a metal oxide of, a metal nitride of, or a metal silicate of hafnium (Hf), aluminum (Al), zirconium (Zr), lanthanum (La), magnesium (Mg), barium (Ba), Titanium (Ti), lead (Pb), multilayers thereof, or any combination thereof. The high-K dielectric layer 114 may be deposited by a CVD process, a sub-atmospheric CVD (SACVD) process, a FCVD process, an ALD process, a PVD process, or any suitable deposition technique. The high-K dielectric layer 114 may have a thickness H1 in a range from about 10 nm to about 200 nm, although greater or lesser thickness may also be used.

Figure 4A:
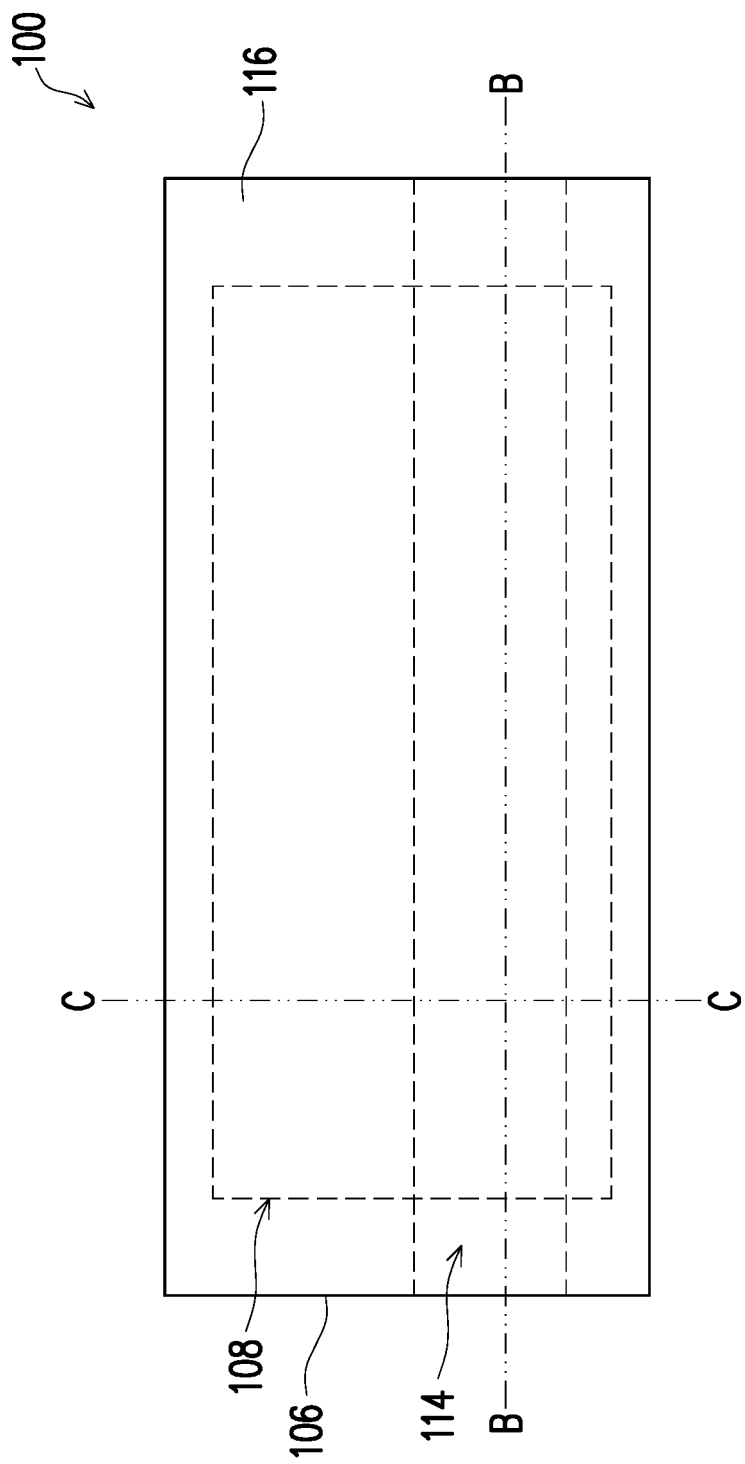
Figure 4B:
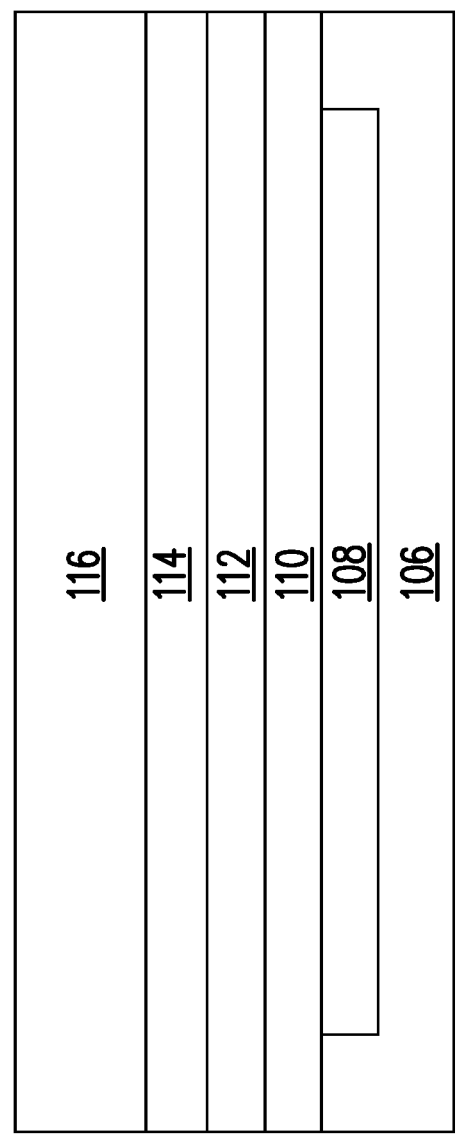
Figure 4C:
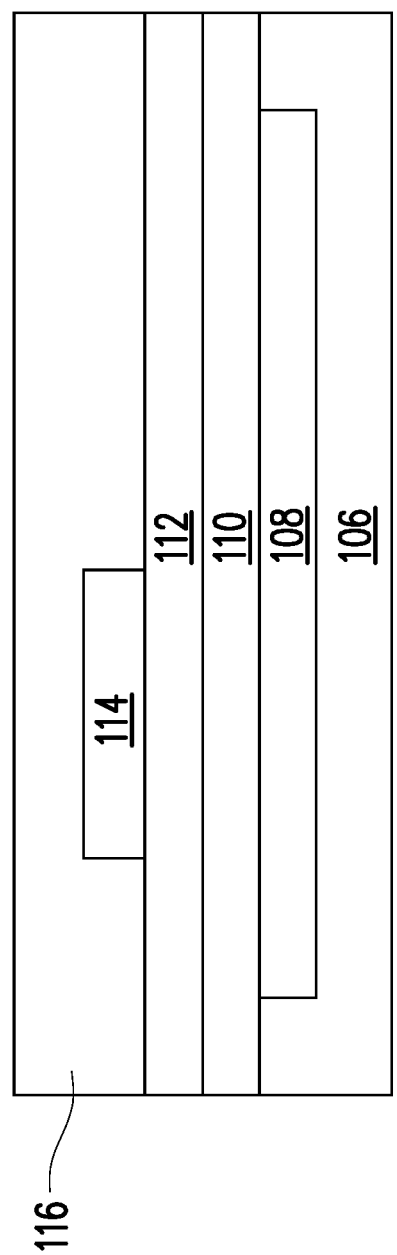

FIGS. 4A-4C show a stage after formation of an interlayer dielectric over the high-K dielectric layer 114 and the exposed metal oxide semiconductor layer 112, in accordance with some embodiments of the present disclosure. As shown in FIGS. 4A-4C, a first interlayer dielectric (ILD) 116 is formed on the high-K dielectric layer 114 and the portions of the metal oxide semiconductor layer 112 not covered by the high-K dielectric layer 114. Suitable materials for the first ILD 116 may include, but are not limited to, compounds comprising Si, O, C, and/or H, such as tetraethylorthosilicate (TEOS) oxide, un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The first ILD 116 may be deposited by a PECVD process or other suitable deposition technique. In some embodiments, after formation of the first ILD 116, the memory device 100 may be subject to a thermal process to anneal the first ILD 116.

Figure 5A:
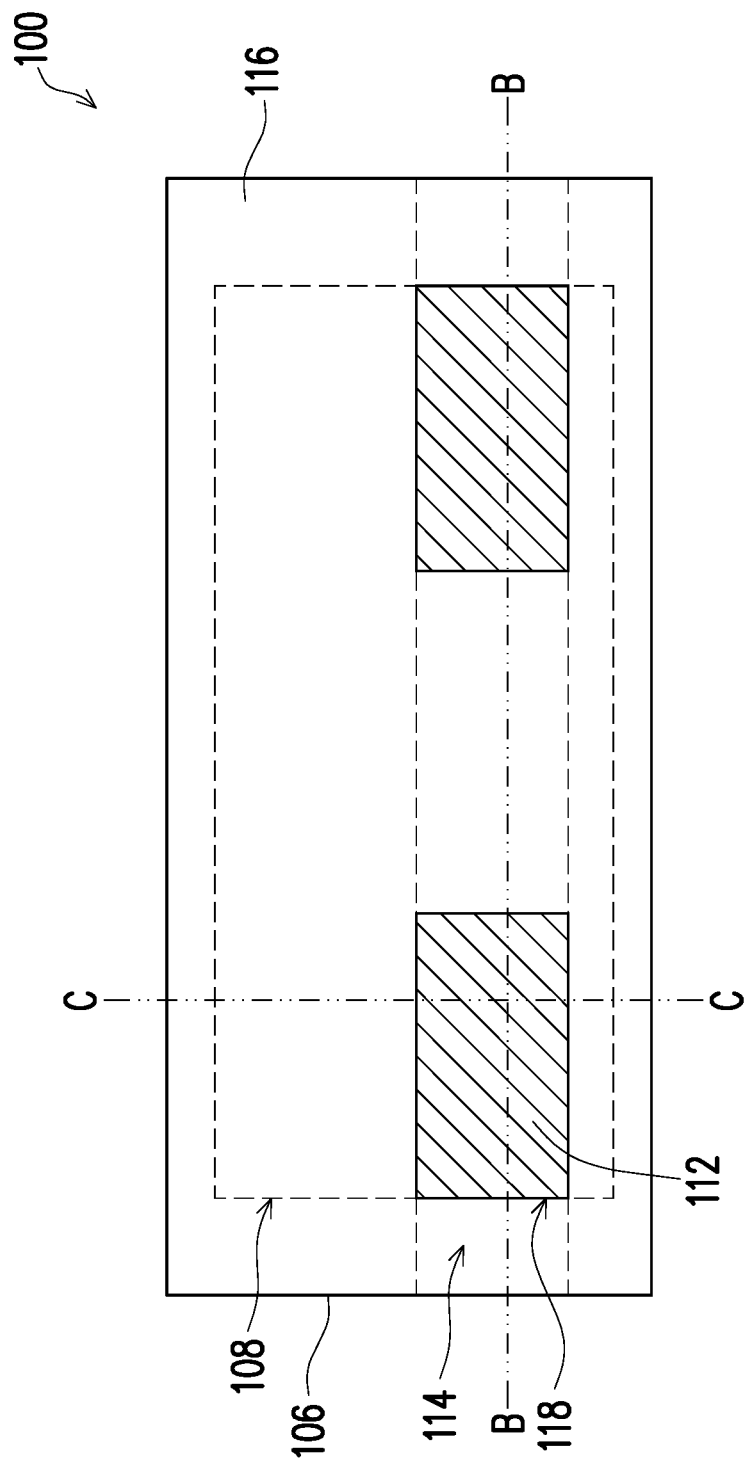
Figure 5B:
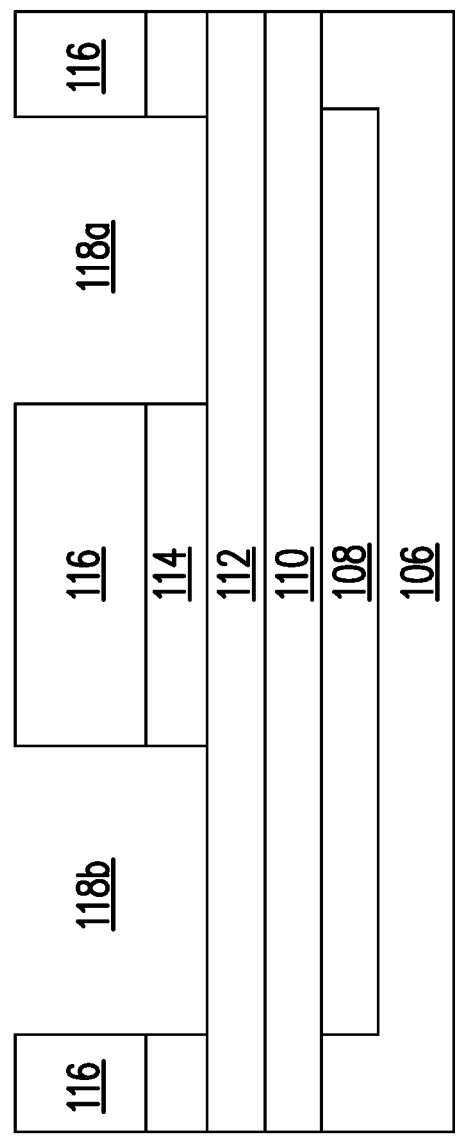
Figure 5C:
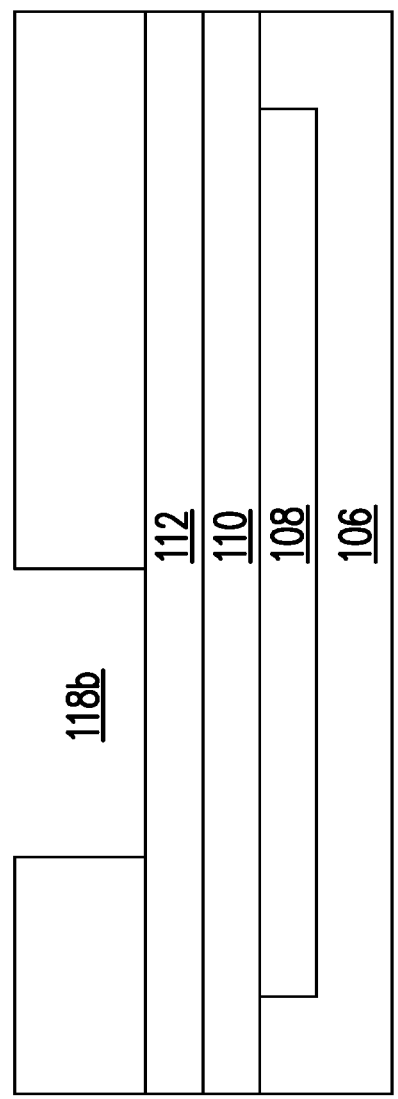

FIGS. 5A-5C show a stage after formation of openings in the first ILD 116 and the high-K dielectric layer 114, in accordance with some embodiments of the present disclosure. As shown in FIGS. 5A-5C, portions of the first ILD 116 and the high-K dielectric layer 114 are removed to form openings 118a, 118b (collectively referred to as openings 118). The openings 118 may have a rounded or quadrilateral shape. In some embodiments, the openings 118 have a rectangular or square shape. In some embodiments, the openings 118 are arranged above the gate electrode 108. In some embodiments, the edge of the openings 118 may be within or extend over an edge of the gate electrode 108. The openings 118 define source/drain (S/D) regions to be formed in the memory device 100. The openings 118 extend through the first ILD 116 and the high-K dielectric layer 114 to expose portions of the top surfaces of the metal oxide semiconductor layer 112. The openings 118 may be formed by a photolithography process and one or more etch processes. The one or more etch processes may be any suitable process, such as a dry etch, a wet etch, or a combination thereof. In some embodiments, the one or more etch process is a selective etch process that removes the first ILD 116 and the high-K dielectric layer 114 but does not remove the metal oxide semiconductor layer 112.

Figure 6B:
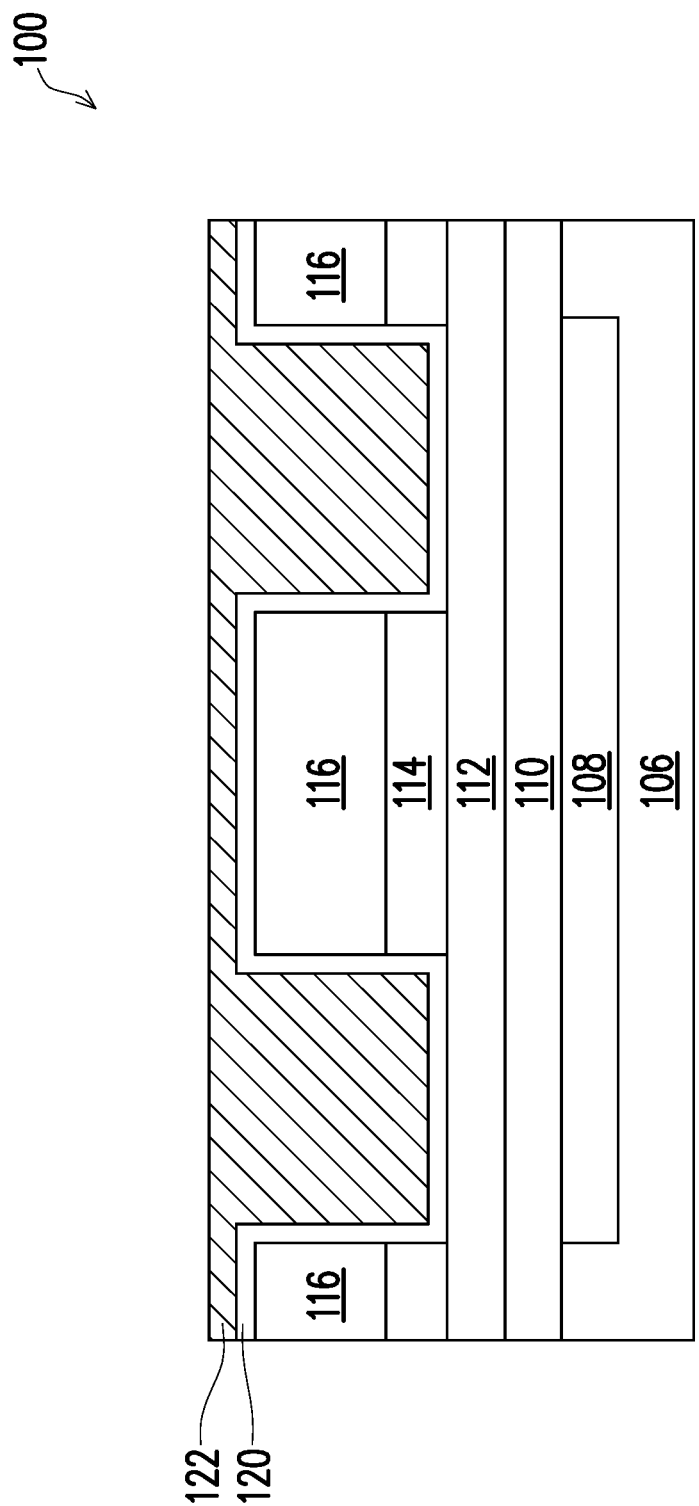
Figure 6C:
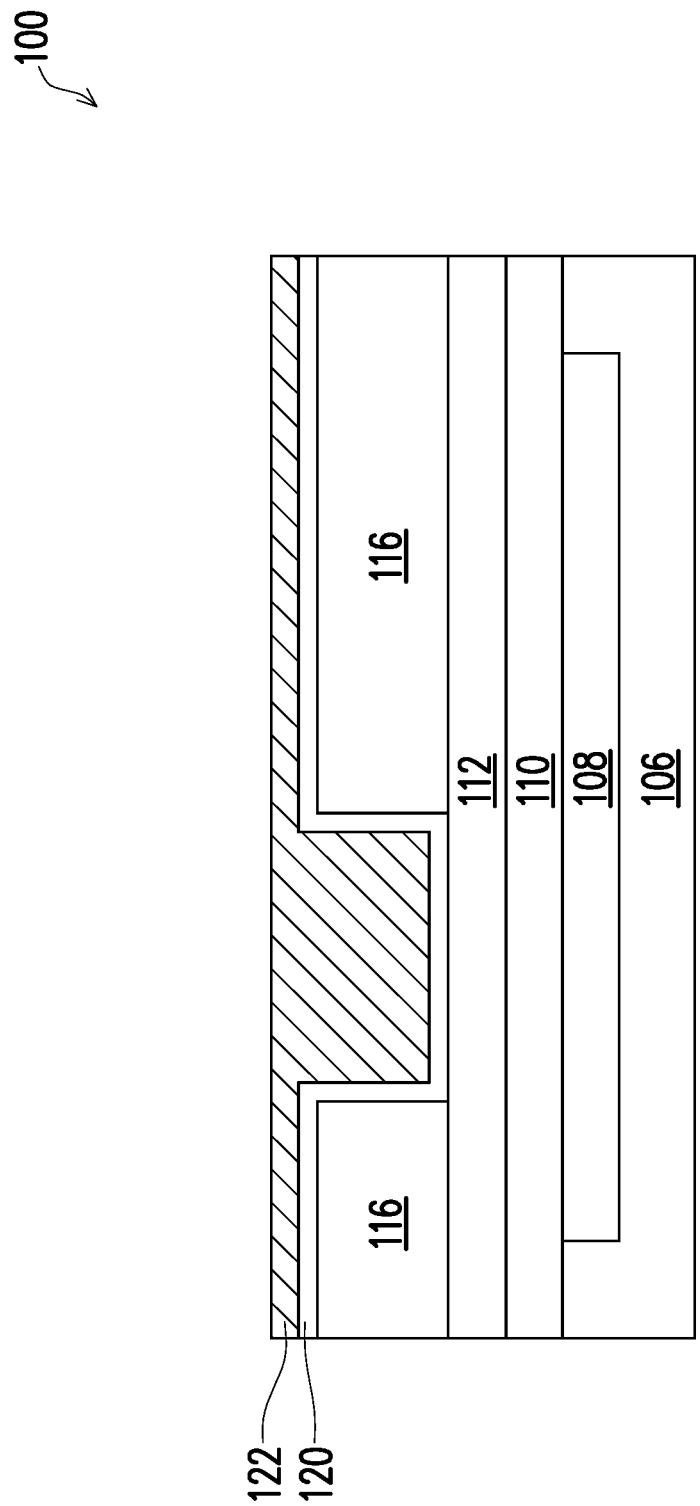

FIGS. 6A-6C show a stage after formation of a glue layer and a conductive material, in accordance with some embodiments of the present disclosure. As shown in FIGS. 6B and 6C, a first glue layer 120 is formed on the exposed surfaces of the first ILD 116, the high-K dielectric layer 114, and the metal oxide semiconductor layer 112 within the openings 118 (FIGS. 5B and 5C). The first glue layer 120 is also formed on the top surface of the first ILD 116. In some embodiments, the first glue layer 120 includes an electrically conductive material, such as TiN or TaN. The first glue layer 120 has a thickness ranging from about 1 nm to about 10 nm, and may be formed by a conformal deposition process such as ALD. After the first glue layer 120 is formed, a conductive material 122 is formed on the first glue layer 120 within the openings 118 and over the first ILD 116. The conductive material 122 may include an electrically conductive material, such as a metal. In some embodiments, the conductive material 122 includes W, Ru, Co, Cu, Mo, or other suitable metal. The conductive material 122 may be formed by any suitable process, such as ECP or PVD.

Figure 7A:
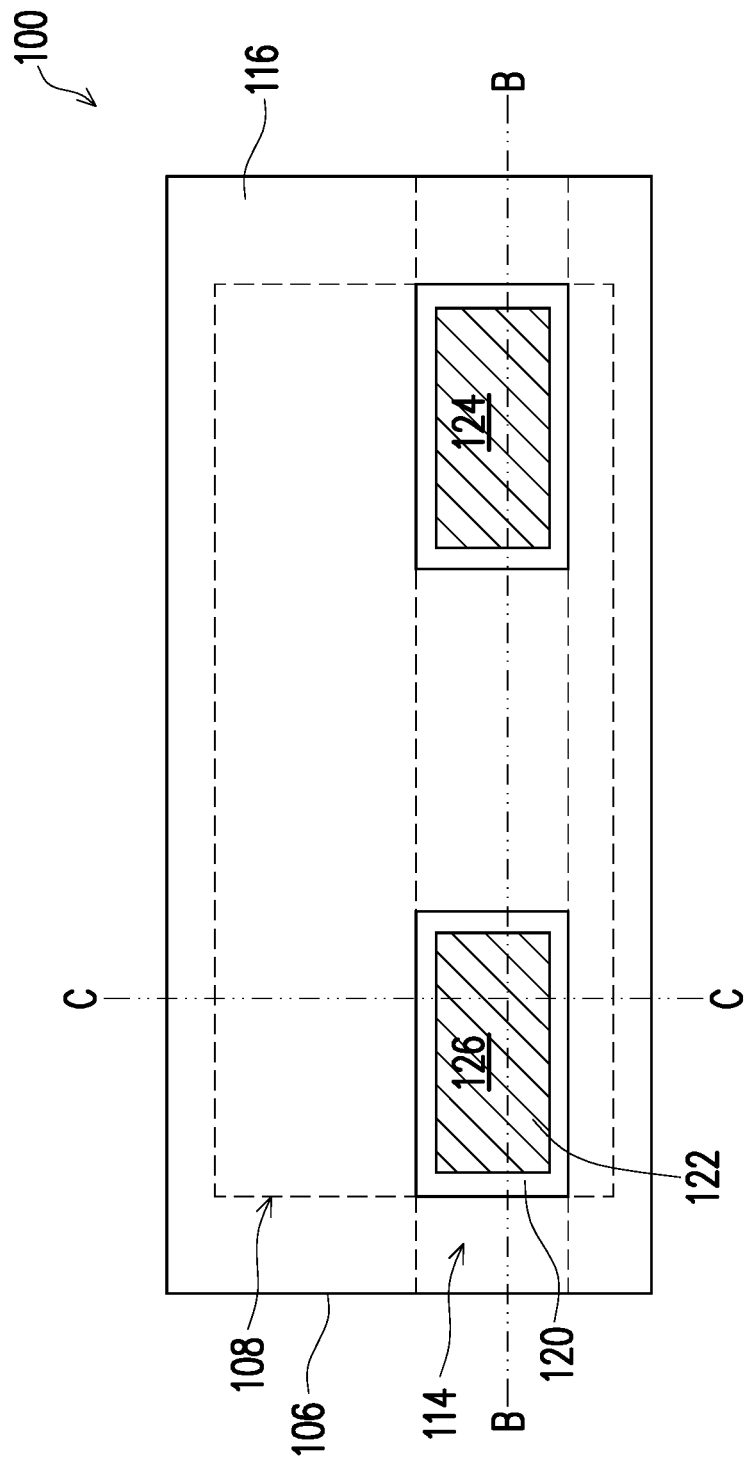
Figure 7B:
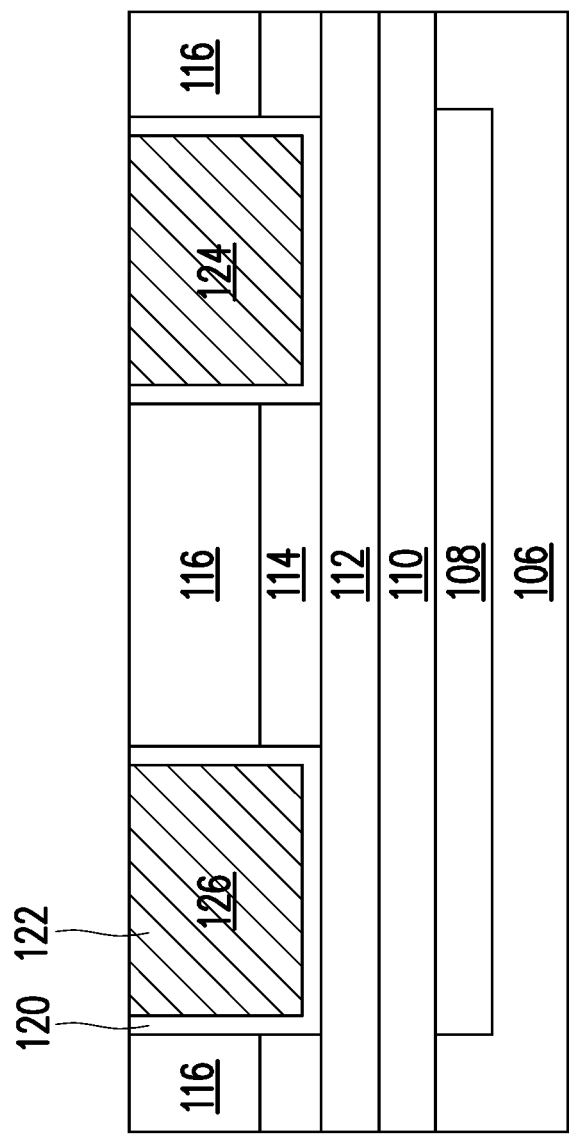
Figure 7C:
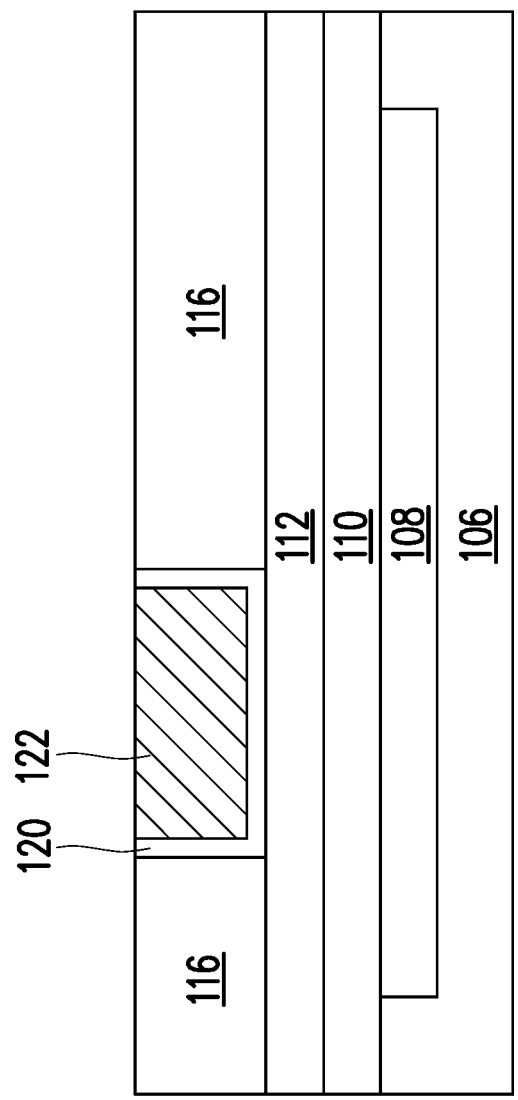

FIGS. 7A-7C show a stage after a planarization process is performed on the memory device 100, in accordance with some embodiments of the present disclosure. The planarization process may be a CMP process. The planarization process is performed to remove portions of the first glue layer 120 and the conductive material 122 over the first ILD 116. The planarization process may be performed until a top surface of the first ILD 116 is exposed. Upon completion of the planarization process, the top surfaces of the first ILD 116, the first glue layer 120, and the conductive material 122 are substantially co-planar. The conductive material 122 remains within the openings 118 (FIGS. 5B and 5C) and the first glue layer 120 form source/drain (S/D) regions. In one exemplary embodiment shown in FIGS. 7A-7B, the conductive material 122 disposed within the opening 118a (FIG. 5B) is designated as a source feature 124 and the conductive material 122 disposed within the opening 118b (FIG. 5B) is designated as a drain feature 126. The source feature 124 and the drain feature 126 are disposed at the same elevation and separated from each other by the high-K dielectric layer 114 and the first ILD 116. Depending on the application, the source feature 124 may have a dimension that is greater, equal to, or less than a dimension of the drain feature 126.

Figure 8A:
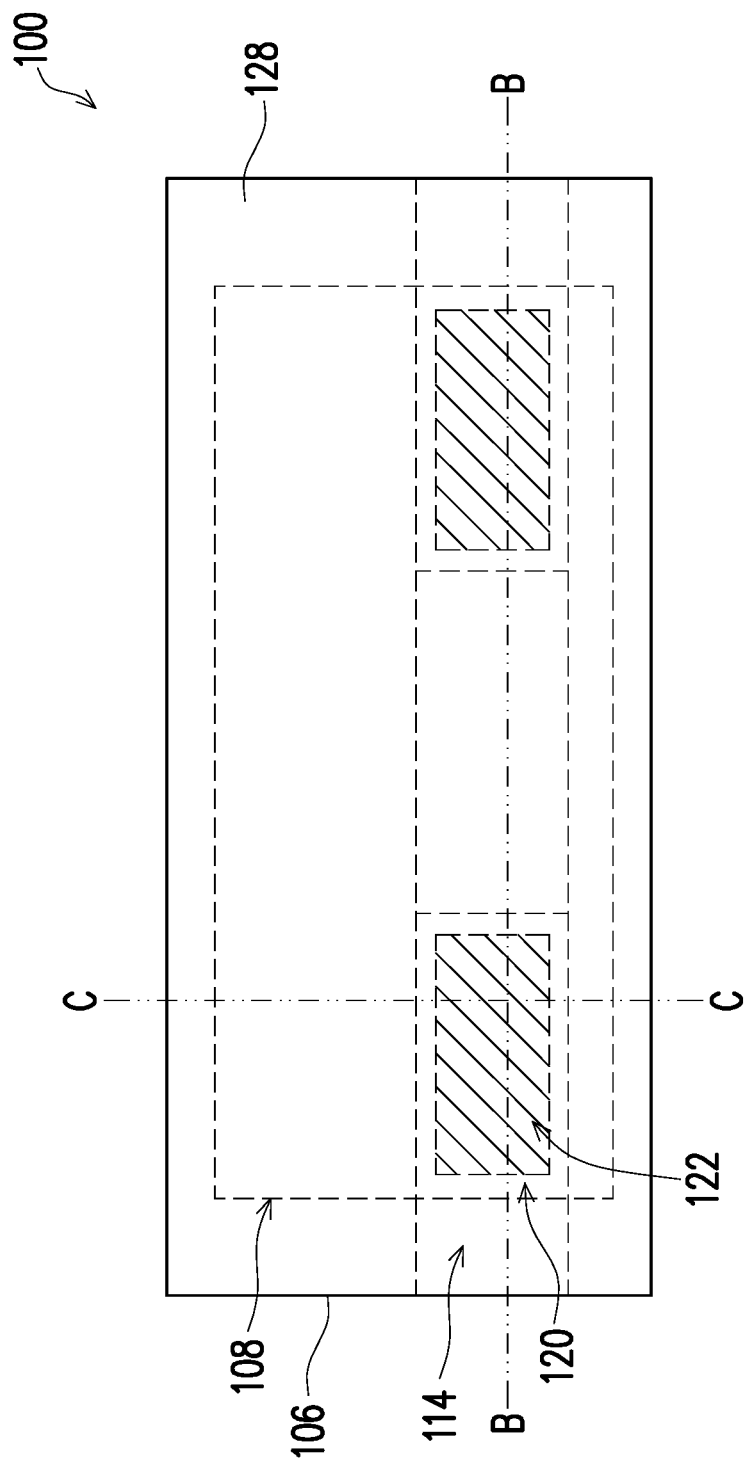
Figure 8B:
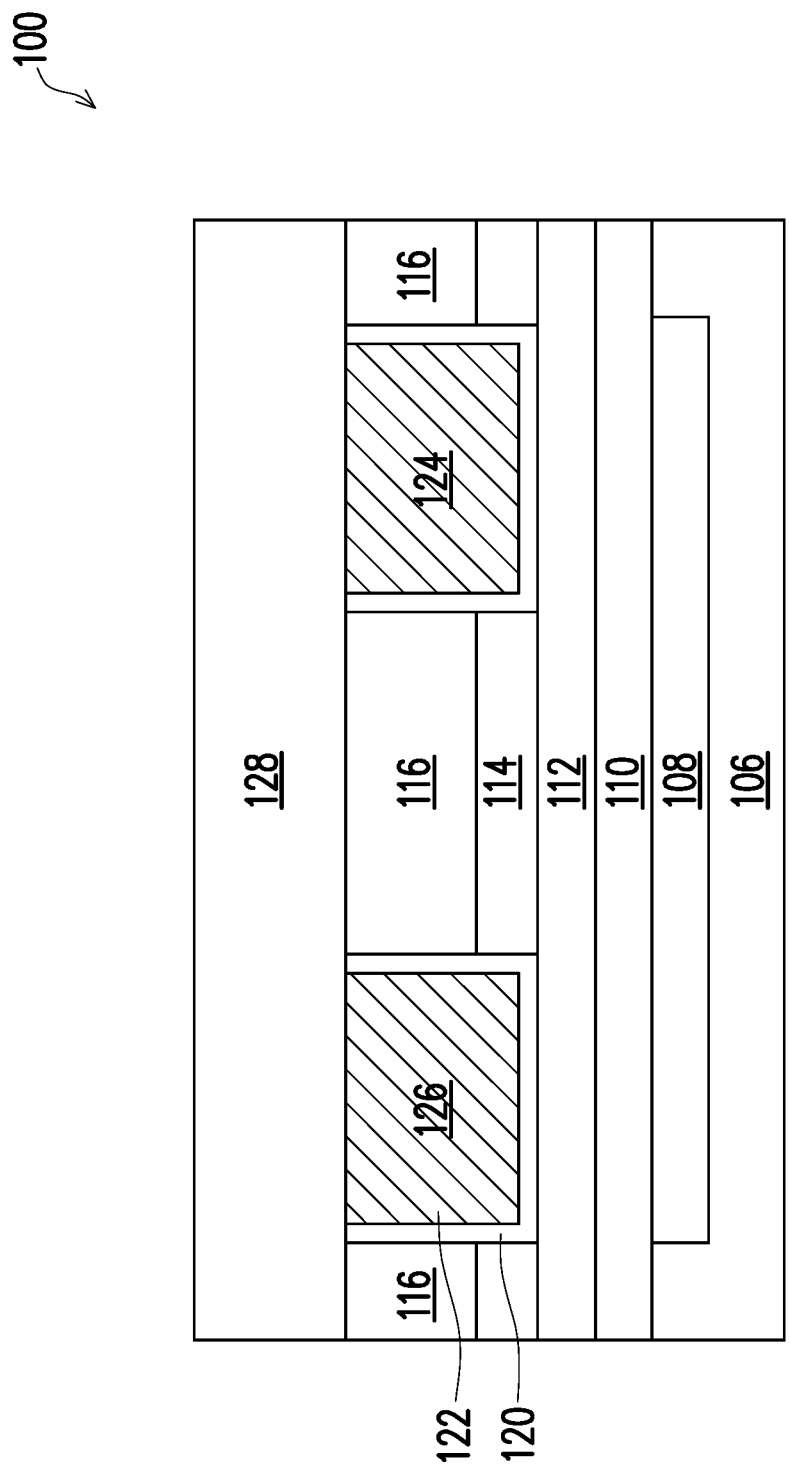
Figure 8C:
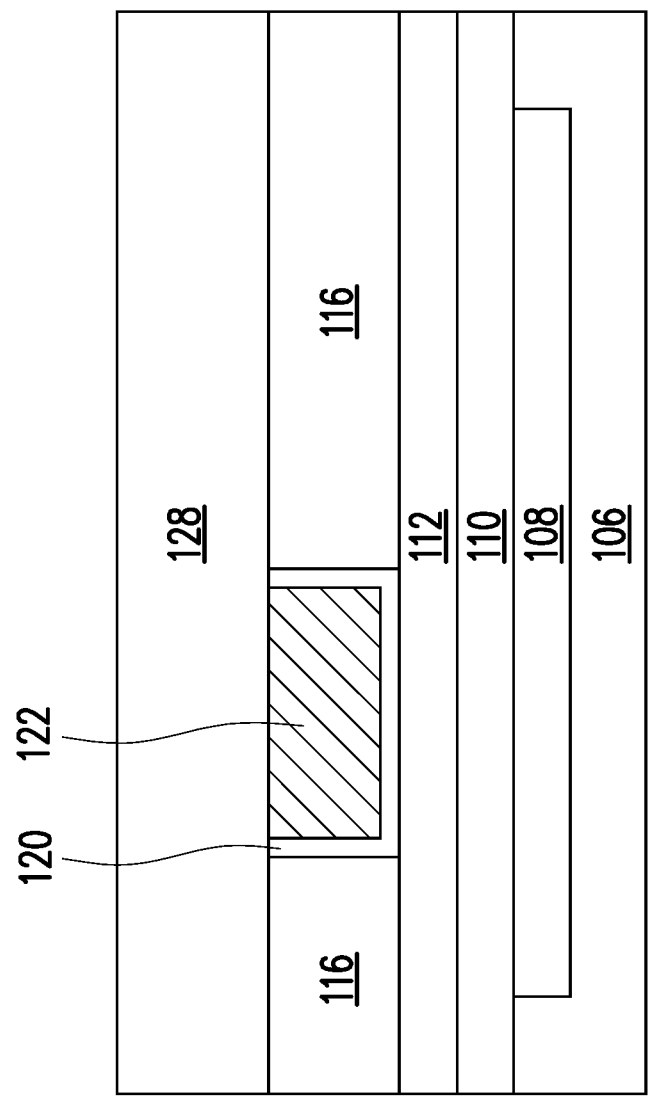

FIGS. 8A-8C show a stage after formation of a second ILD over the memory device 100, in accordance with some embodiments of the present disclosure. As shown in FIGS. 8A-8C, a second ILD 128 is formed on the top surfaces of the first ILD 116, the first glue layer 120, and the S/D regions (e.g., source feature 124 and drain feature 126). The second ILD 128 may include the same material as the first ILD 116, and may be formed by the same deposition technique used for forming the first ILD 116. In some embodiments, the first and second ILDs 116, 128 are formed from different materials.

Figure 9A:
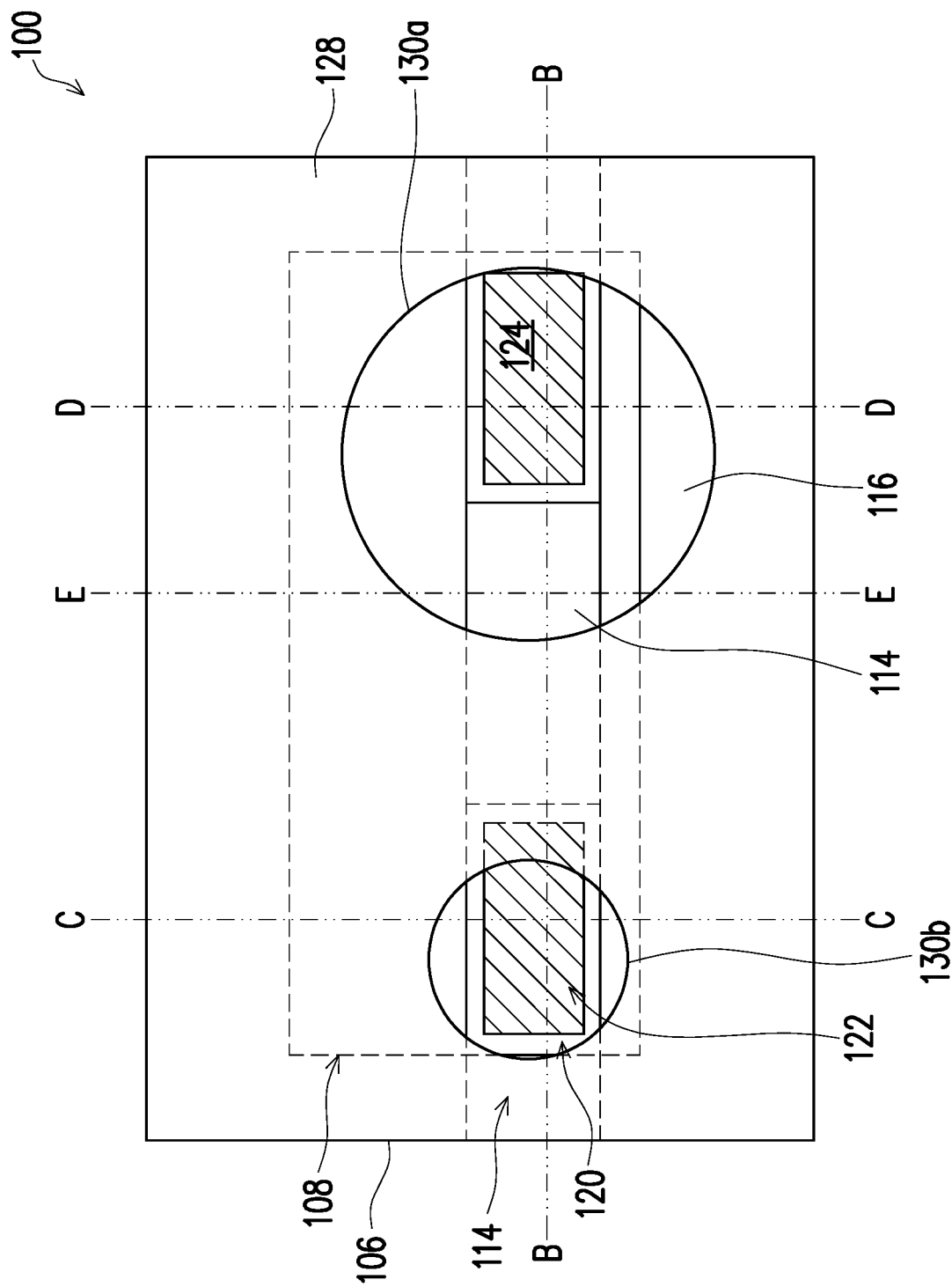
Figure 9B:
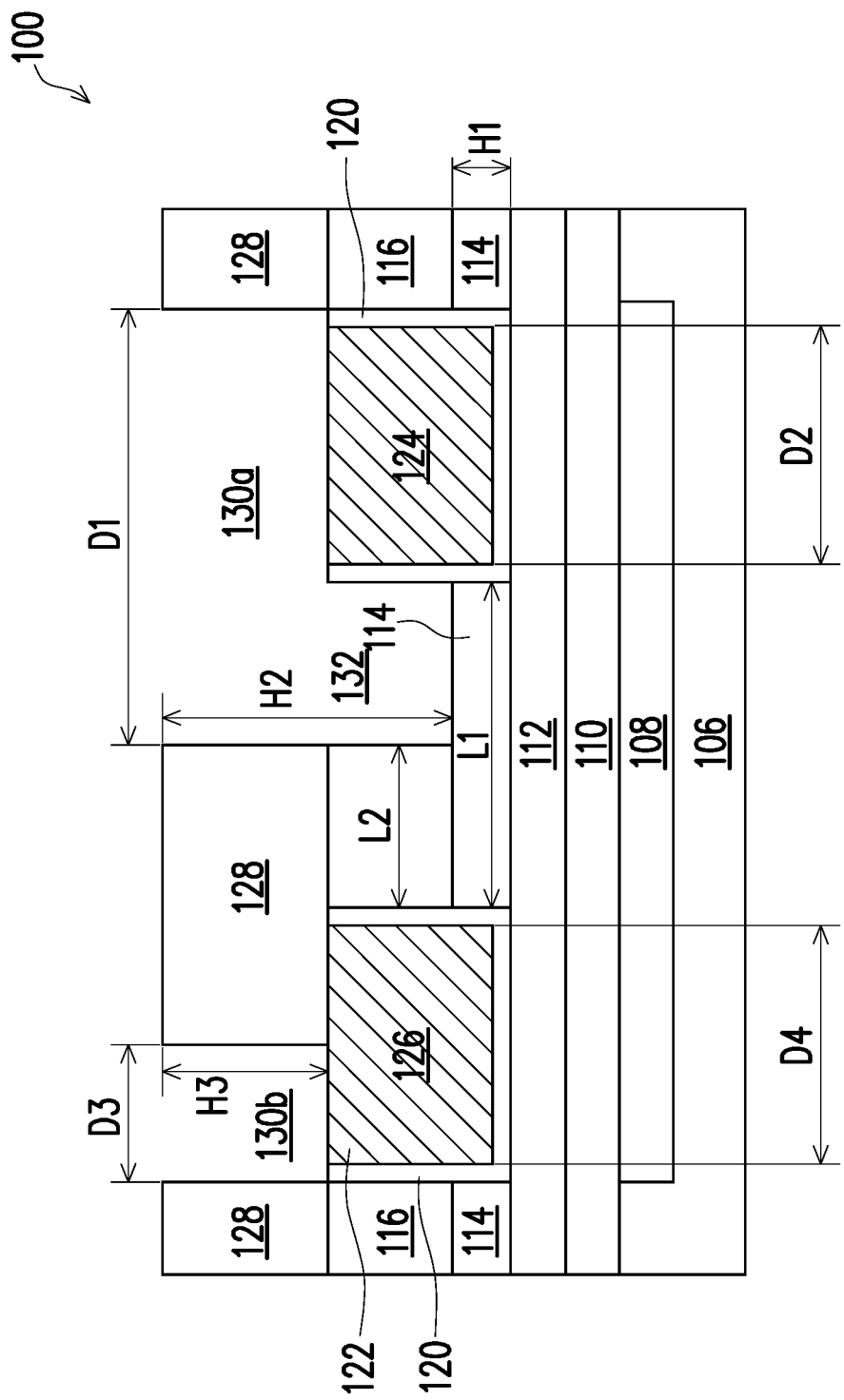
Figure 9C:
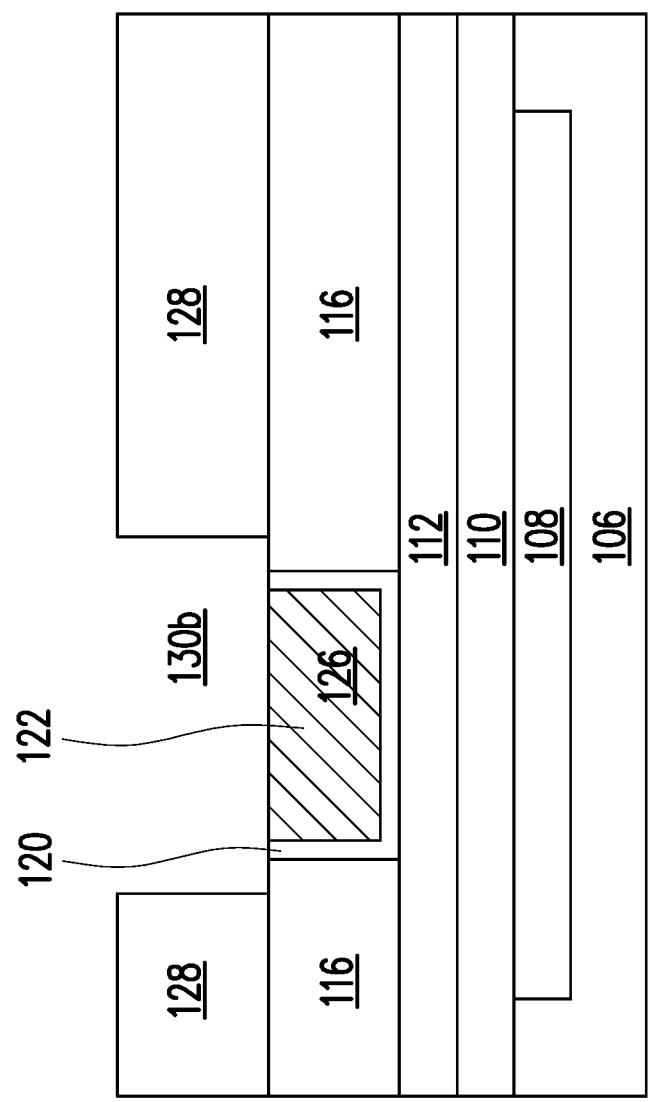
Figure 9D:
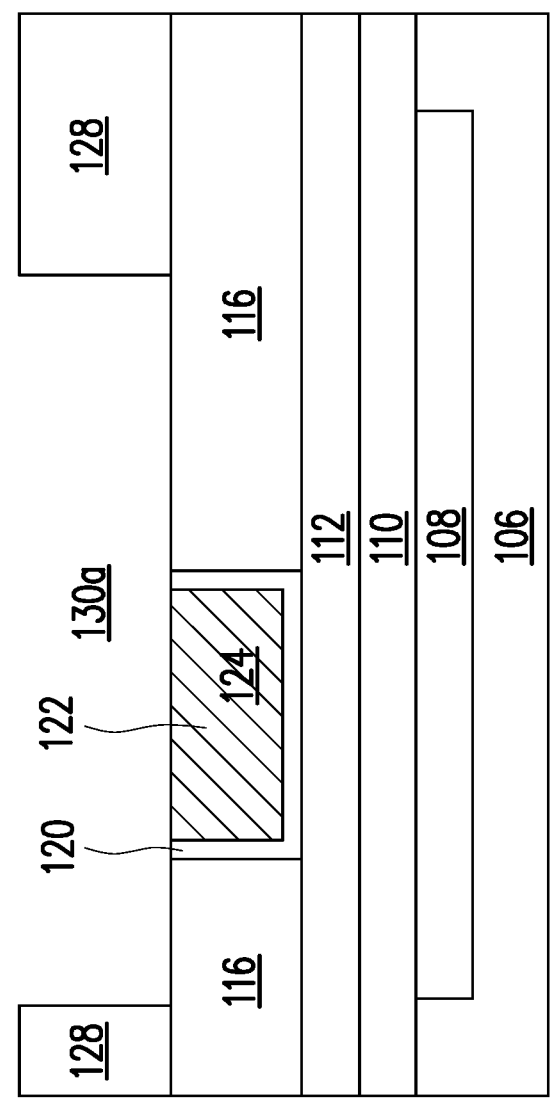
Figure 9E:
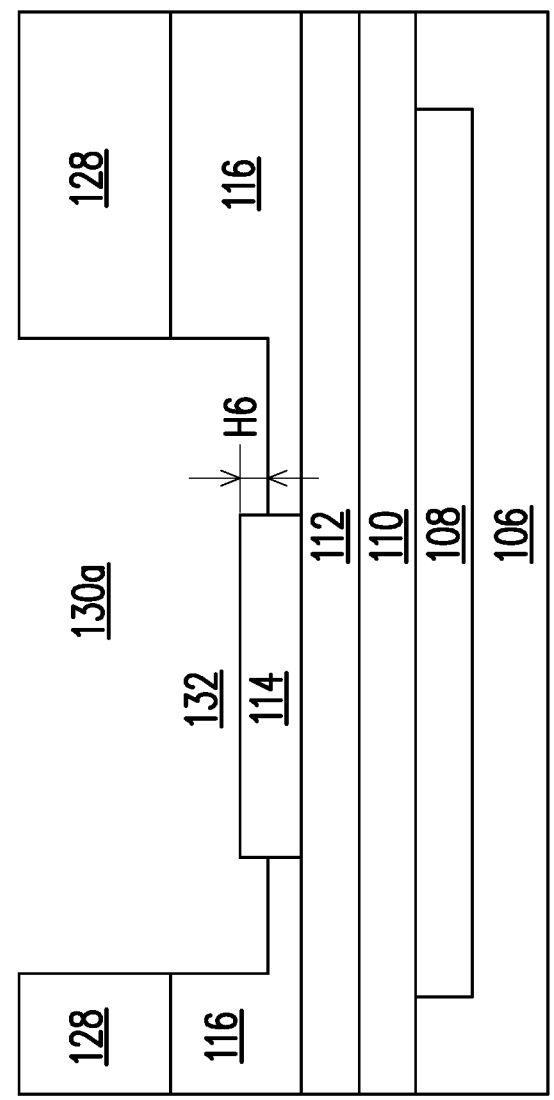
FIG. 9E illustrates a vertical cross-sectional view of the memory device taken along the plane E-E shown in FIG. 9A.
Figure 10A:
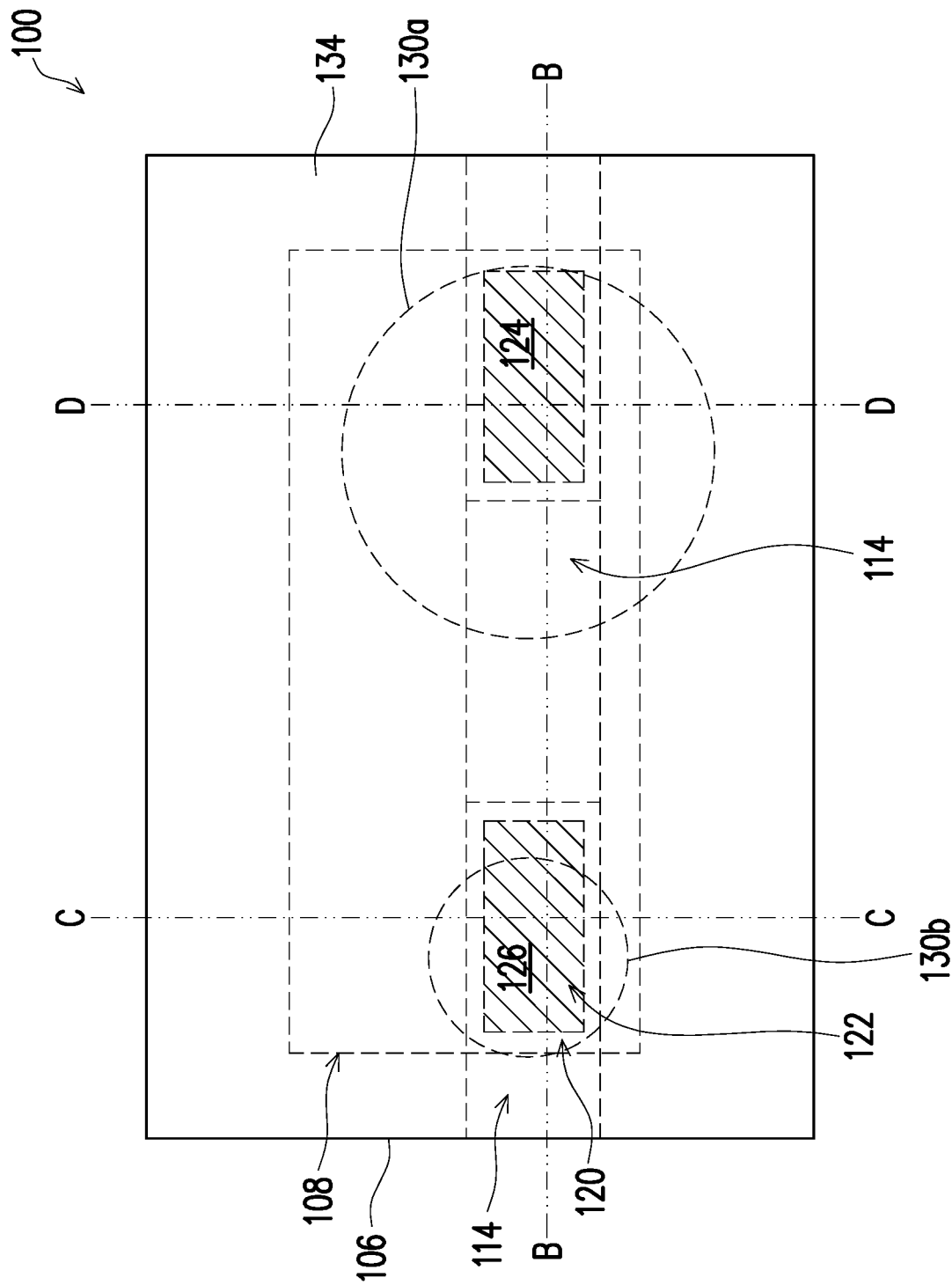
Figure 10B:
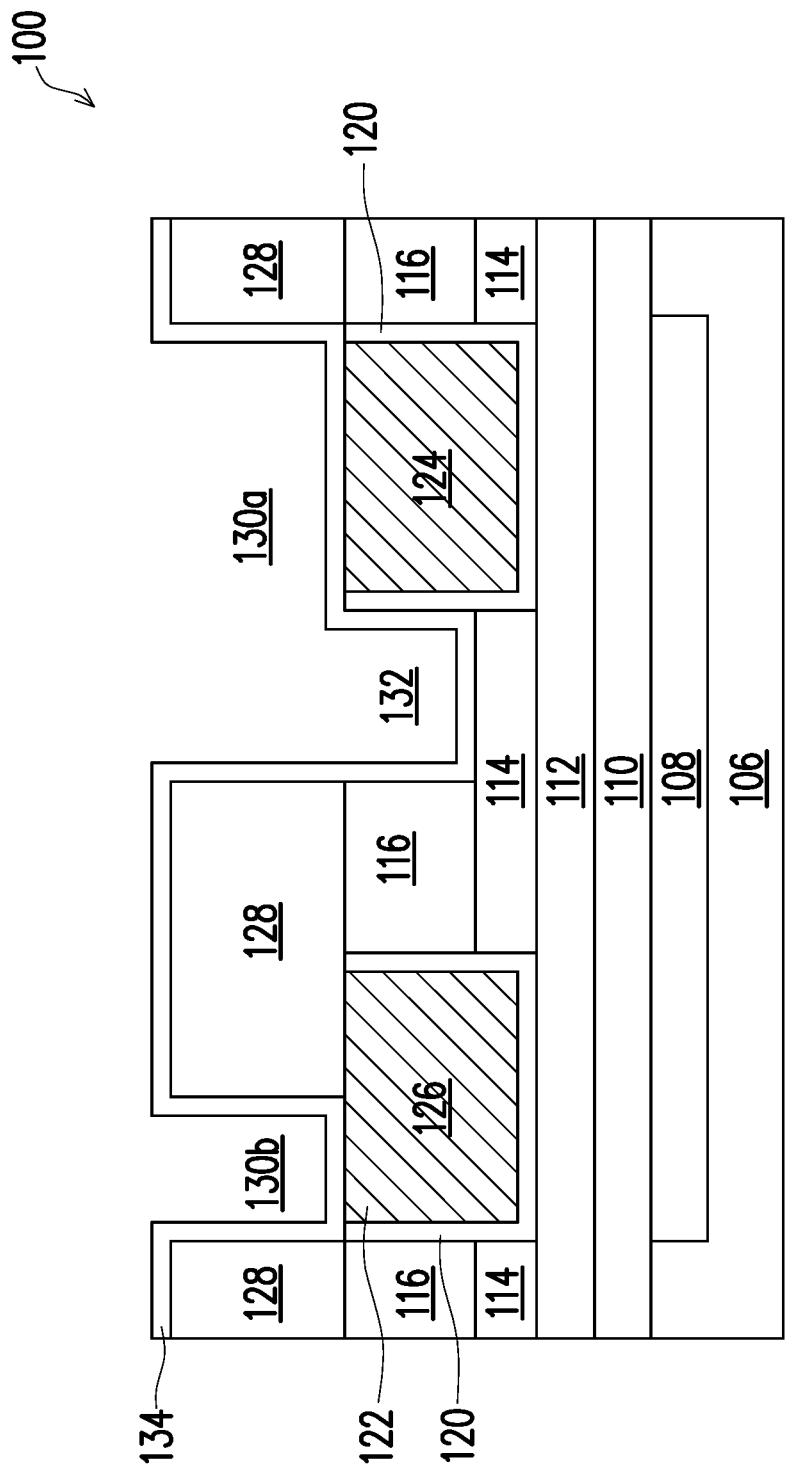
Figure 10C:
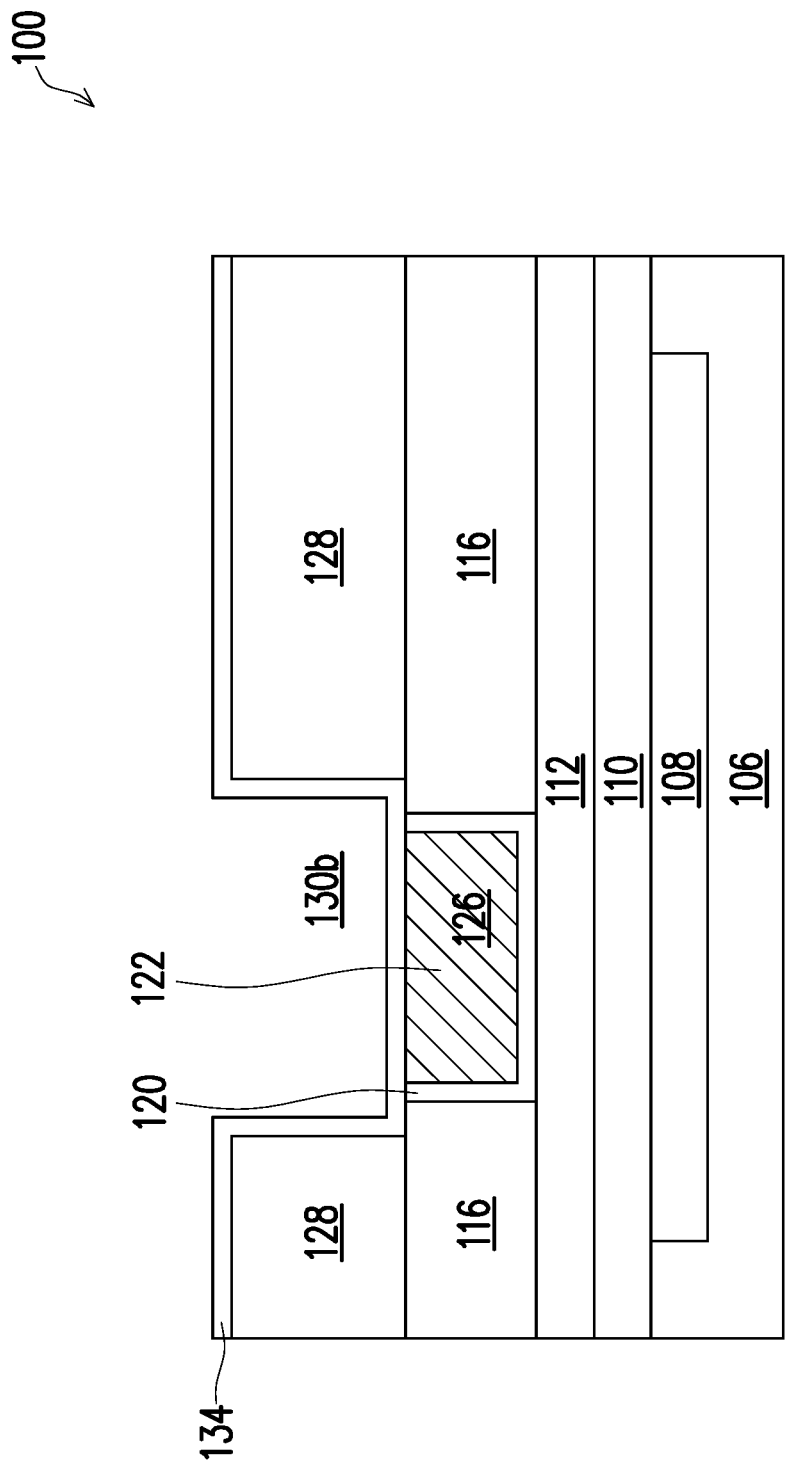
Figure 10D:
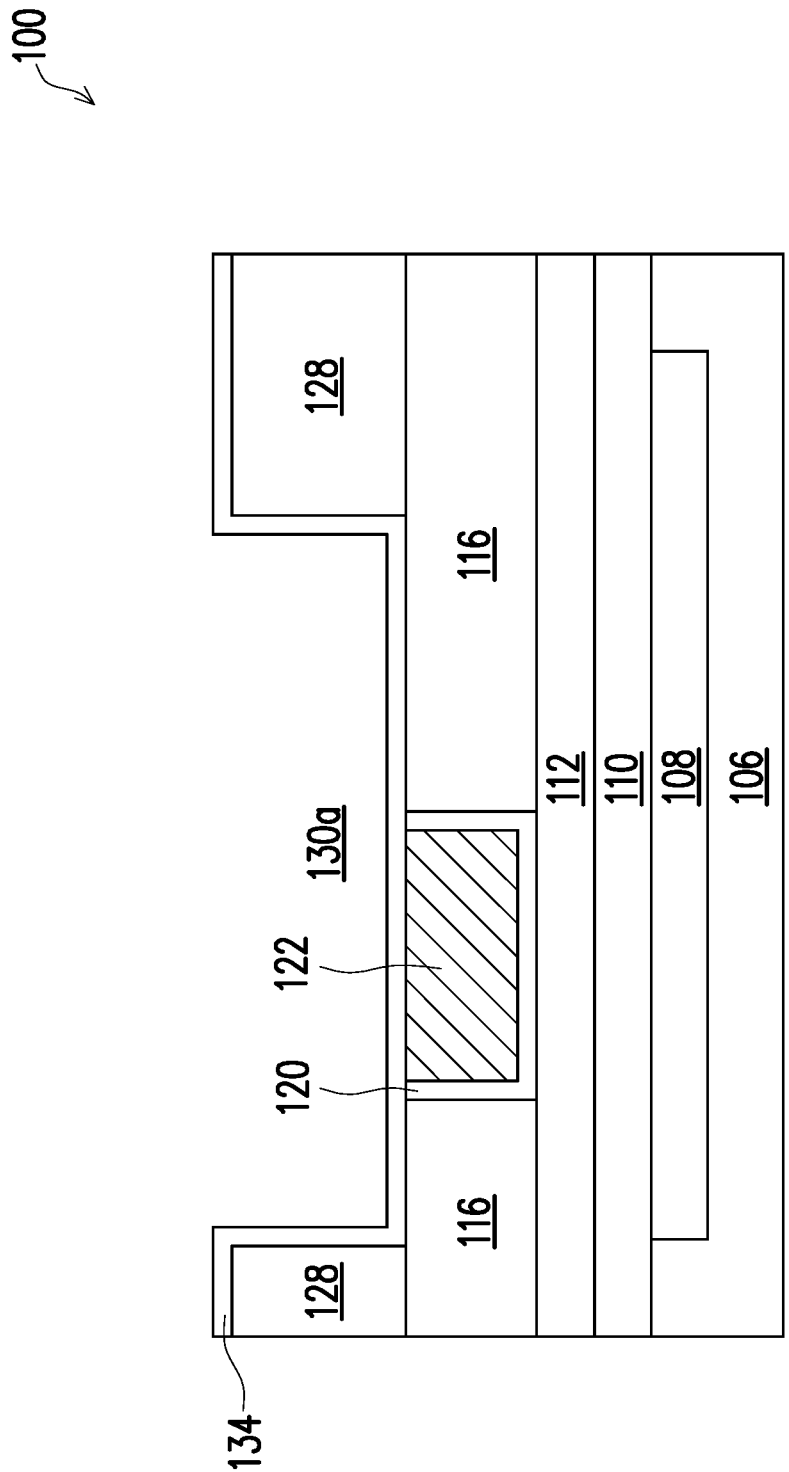

FIGS. 9A-9E show a stage after openings are formed in the first ILD 116 and the second ILD 128, in accordance with some embodiments of the present disclosure. FIG. 9C illustrates a vertical cross-sectional view of the memory device 100 taken along the plane C-C shown in FIG. 9A. The plane C-C is perpendicular to the plane B-B and extending across the drain feature 126. FIG. 9D illustrates a vertical cross-sectional view of the memory device 100 taken along the plane D-D shown in FIG. 9A. The plane D-D is perpendicular to the plane B-B and extending across the source feature 124. FIG. 9E illustrates a vertical cross-sectional view of the memory device 100 taken along the plane E-E shown in FIG. 9A. The plane E-E is perpendicular to the plane B-B and extending across the high-K dielectric layer 114. As shown in FIGS. 9A-9B, openings 130a, 130b (collectively referred to as openings 130) and openings 132 (FIG. 9B) are formed in and through the second ILD 128 and the first ILD 116, respectively. The openings 130, 132 are intended to be filled with a conductive material to form source/drain extensions (e.g., source/drain extensions 138, 140 in FIG. 11B) therein. While the opening 130b is shown with a diameter greater than the width of the drain feature 126, it is contemplated that the diameter of the opening 130b may be made less than that of the width of the drain feature 126. As will be discussed in more detail below, the source/drain extensions enlarge the S/D regions to enhance the coupling electric field in the ferroelectric dielectric layer 110 during the program and erase operations.

The opening 130a at or immediately above the source feature 124 has a dimension D1 measuring along the longitudinal direction of the high-K dielectric layer 114, and the source feature 124 has a dimension D2 measuring along the longitudinal direction of the high-K dielectric layer 114. In various embodiments, the dimension D1 is greater than the dimension D2. In some embodiments, the dimension D1 and the dimension D2 may have a ratio (D1:D2) in a range of about 1.2:1 to about 2:1, for example about 1.5:1. The opening 130b at or immediately above the drain feature 126 has a dimension D3 measuring along the longitudinal direction of the high-K dielectric layer 114, and the drain feature 126 has a dimension D4 measuring along the longitudinal direction of the high-K dielectric layer 114. In various embodiments, the dimension D3 is less than the dimension D4. In some embodiments, the dimension D3 and the dimension D4 may have a ratio (D3:D4) in a range of about 1:1.5 to about 1:2, for example about 1:1.8. The dimension D1 of the opening 130a is greater than the dimension D3 of the opening 130b. In various embodiments, the dimension D1 and the dimension D3 may have a ratio (D1:D3) in a range of about 2:1 to about 3:1, for example about 2.5:1.

While the openings 130, 132 are shown as a round shape in FIG. 9A, other shapes, such as square, oval, or rectangular, are also contemplated. In some embodiments, the openings 130, 132 have a first shape (e.g., round) and the S/D features 124, 126 have a second shape (e.g., rectangular or square) that is different than the first shape. In some embodiments, the openings 130, 132 have a first shape (e.g., round) and the S/D features 124, 126 have a second shape that is the same as the first shape.

The openings 130, 132 may be formed by one or more etch processes, such as a dry etch, wet etch, or a combination thereof. In some embodiments, the openings 130, 132 are formed by one single etch process. The etch process may use an etchant that is selective to the first and second ILDs 116, 128 without substantially affecting the high-K dielectric layer 114, the glue layer 120, the source feature 124, and the drain feature 126. The etch process may be performed until the top surface of the high-K dielectric layer 114 is exposed. The etch process may also remove a portion of the first ILD 116 if the same material was used for both first and second ILDs 116, 128. In such cases, a portion of the first ILD 116 adjacent the high-K dielectric layer 114 may be over-etched during the formation of the openings 130a. FIG. 9E illustrates one exemplary embodiment where a portion of the first ILD 116 adjoining the high-K dielectric layer 114 is slightly over-etched, resulting in a difference in height H6 between the top surface of the high-K dielectric layer 114 and the top surface of the exposed first ILD 116.

In some embodiments, openings 130, 132 are formed by a multiple etch process. The multiple etch process may be advantageous when the first and second ILDs 116, 128 are made of different materials. For example, a two-step etch process may be used to form openings 130, 132 in the first and second ILDs 116, 128. In such cases, a first etch process may be performed to form openings 130 in the second ILD 128 and a second etch process may be performed to form opening 132 in the first ILD 116. The first etch process may use an etchant that selectively removes portions of the second ILD 128 but does not substantially affect the first ILD 116, the glue layer 120, the source feature 124, and the drain feature 126. The first etch process may be performed until the top surfaces of a portion of the first ILD 116, the glue layer 120, the source feature 124, and/or the drain feature 126 are exposed. Thereafter, the second etch process may be performed to remove a portion of the exposed first ILD 116. The second etch process may use an etchant that selectively removes the first ILD 116 but does not substantially remove the high-K dielectric layer 114, the glue layer 120, the source feature 124, the drain feature 126, and the second ILD 128. The second etch process exposes a top surface of the high-K dielectric layer 114 and a portion of the exposed glue layer 120 (e.g., sidewall of the glue layer 120 that is in contact with the source feature 124). The second etch process may be performed until the top surface of the high-K dielectric layer 114 is exposed.

As a result of the one or more etch processes, the openings 130, 132 are formed in the second ILD 128 and the first ILD 116, respectively. The opening 130a and the opening 132 at the source feature 124 may have a combined height H2 measuring from a top surface of the second ILD 128 to the top surface of the exposed high-K dielectric layer 114. The opening 130b at the drain feature 126 may have a height H3 measuring from the top surface of the second ILD 128 to the top surface of the drain feature 126 (or the exposed first glue layer 120). The height H2 is greater than the height H3. The high-K dielectric layer 114 between two adjacent S/D features (e.g., source feature 124 and the drain feature 126) has a length L1 and the portion of the first ILD 116 remaining between two adjacent S/D features (e.g., source feature 124 and the drain feature 126) has a length L2 that is less than the length L1. In some embodiments, the length L1 and the length L2 may have a ratio (L1:L2) in a range of about 1.5:1 to about 2.5:1, for example about 2:1. If the ratio (L1:L2) is less than 1.5:1, an unwanted coupling may form between the source feature 124 and the drain feature 126, leading to short channel effects and off-state leakage current. On the other hand, if the ratio (L1:L2) is greater than 2.5:1, the room left for a subsequent conductive material to fill in the openings 132 will be small, which diminishes the benefits associated with forming the source/drain extensions (e.g., source/drain extensions 138, 140 as shown in FIG. 11B).

FIGS. 10A-10D show a stage after formation of a glue layer in the openings 130, 132, in accordance with some embodiments of the present disclosure. In FIGS. 10A-10D, a second glue layer 134 is formed on the exposed surfaces of the high-K dielectric layer 114, the first ILD 116, the first glue layer 120, the source feature 124, the drain feature 126, and the second ILD 128 within the openings 130, 132. The second glue layer 134 is also formed on the top surface of the second ILD 128. The second glue layer 134 may include the same or different material than the first glue layer 120, and may be formed by a conformal deposition process such as ALD.

FIGS. 11A-11D show a stage after formation of a conductive material layer on the glue layer, in accordance with some embodiments of the present disclosure. In FIGS. 11A-11D, after the second glue layer 134 is formed, a conductive material 136 is formed on the second glue layer 134 within the openings 130, 132 and over the second ILD 128. The conductive material 136 may include the same or different material than the conductive material used for the source/drain features 124, 126, and may be formed by any suitable process, such as ECP or PVD. Next, a planarization process, such as a CMP process, is performed on the memory device 100. The planarization process is performed to remove portions of the second glue layer 134 and the conductive material 136 over the second ILD 128. The planarization process may be performed until the top surface of the second ILD 128 is exposed. Upon completion of the planarization process, the top surfaces of the second ILD 128, the second glue layer 134, and the conductive material 136 are substantially co-planar.

The conductive material 136 remains within the openings 130a, 130b (FIG. 10B) and the second glue layer 134 form a source extension 138 and a drain extension 140, respectively. Particularly, the source extension 138 and the drain extension 140 are size-asymmetric with respect to each other, while the source feature 124 and the drain feature 126 are size-symmetric. The source extension 138 is in electrical connection with the source feature 124 and the drain extension 140 is in electrical connection with the drain feature 126. The source/drain extensions 138, 140 serve as a source to provide additional hole carriers (positive charges) to work with the electrons (negative charges) formed at the gate electrode 108 when an external negative voltage (e.g., negative writing voltage Vwrite) is applied to the gate electrode 108. Since the source extension 138 extends laterally from the source feature 124 and overlap with the metal oxide semiconductor layer 112, the amount of the hole carriers to be induced in the metal oxide semiconductor layer 112 can be increased, which in turn enhances the coupling electric field in the ferroelectric dielectric layer 110. As a result, a full polarization switching can be obtained in the ferroelectric dielectric layer 110 during the program and erase operations. An enhanced or higher coupling electric field also leads to a wider memory window (i.e., a difference between readout currents when the ferroelectric dielectric layer 110 is respectively at program and erase states) and a prominent voltage drop in the ferroelectric dielectric layer 110, which increases the erase efficiency during the erase operation.

In FIG. 11B, the source extension 138 as formed may be considered to include a first portion 138-1 and a second portion 138-2 integrating with the first portion 138-2 (represented by dotted lines). The second portion 138-2 extends downwardly from an end of the first portion 138-1 to surround at least three sides of a portion of the source feature 124. The first portion 138-1 has a dimension D5 (equal to the dimension D1 shown in FIG. 9B) and the second portion 138-2 has a dimension D6 that is less than the dimension D5 of the first portion 138-1. The first portion 138-1 has a height H4 measuring from a top surface of the first portion 138-1 to a top surface of the source feature 124. The second portion 138-2 has a height H5 measuring from the top surface of the source feature 124 to a top surface of the high-K dielectric layer 114. The height H4 may be greater, equal to, or less than the height H4. In one embodiment, the height H4 is greater than the height H5. The source feature 124 has a height H7 measuring from the top surface of the source feature 124 to a top surface of the metal oxide semiconductor layer 112. The height H7 may be greater, equal to, or less than the height H4 of the first portion 138-1 of the source extension 138. In one embodiment, the height H7 is less than the height H4. The first and second portions 138-1, 138-2 have a combined height (H4+H5) that is greater than the height H7 of the source feature 124.

In some embodiments, the high-K dielectric layer 114 between the source feature 124 and the drain feature 126) has a length L1 (FIG. 9B) that is greater than the dimension D6 of the second portion 138-2 of the source extension 138. In some embodiments, the dimension D6 of the second portion 138-2 may be at least 15% of the length L1, such as about 20% to about 50% of the length L1 of the high-K dielectric layer 114. If the dimension D6 of the second portion 138-2 is 50% or more of the length L1, the first ILD 116 between the source feature 124 and the drain feature 126 is greatly decreased, resulting in unwanted coupling between the source feature 124 and the drain feature 126. This may, in turn, causes short channel effects and increases off-state leakage current. On the other hand, if the dimension D6 of the second portion 138-2 is below 15%, the source extension 138 may not provide enough electric field for polarization of the ferroelectric dielectric layer 110.

In various embodiments, the source extension 138 has a dimension D5 that is greater than the dimension D2 of the source feature 124. The dimension D2 of the source feature 124 is substantially identical to the dimension D4 of the drain feature 126. That is, the source feature 124 and the drain feature are size-symmetric. In some embodiments, the first glue layer 120 and the second glue layer 134 include the same material, such as TiN. In some embodiments, the first glue layer 120 and the second glue layer 134 include a material chemically different from each other. For example, the first glue layer 120 may include TiN and the second glue layer 134 may include TaN. A portion of the first glue layer 120 and a portion of the second glue layer 134 disposed between the conductive material 122 (of the source feature 124) and the conductive material 136 (of the source extension 138) form a glue layer section 142. The glue layer section 142 may have a combined thickness T1 that is greater than the thickness T2 of the first glue layer 120 or the thickness T3 of the second glue layer 134. In some embodiments, the glue layer section 142 has a thickness that is twice of the thickness of the first or second glue layer 120, 134.

Likewise, the drain extension 140 as formed has a height H8 that is substantially equivalent to the height H4 of the first portion 138-1 of source extension 138. The drain feature 126 has a height H9 that may be greater, equal to, or less than the height H8. In one embodiment, the height H8 is greater than the height H9. The drain extension 140 has a dimension D7 that is less than the dimension D4 of the drain feature 126. The drain extension 140 has a round exterior surface.

Figure 11A:
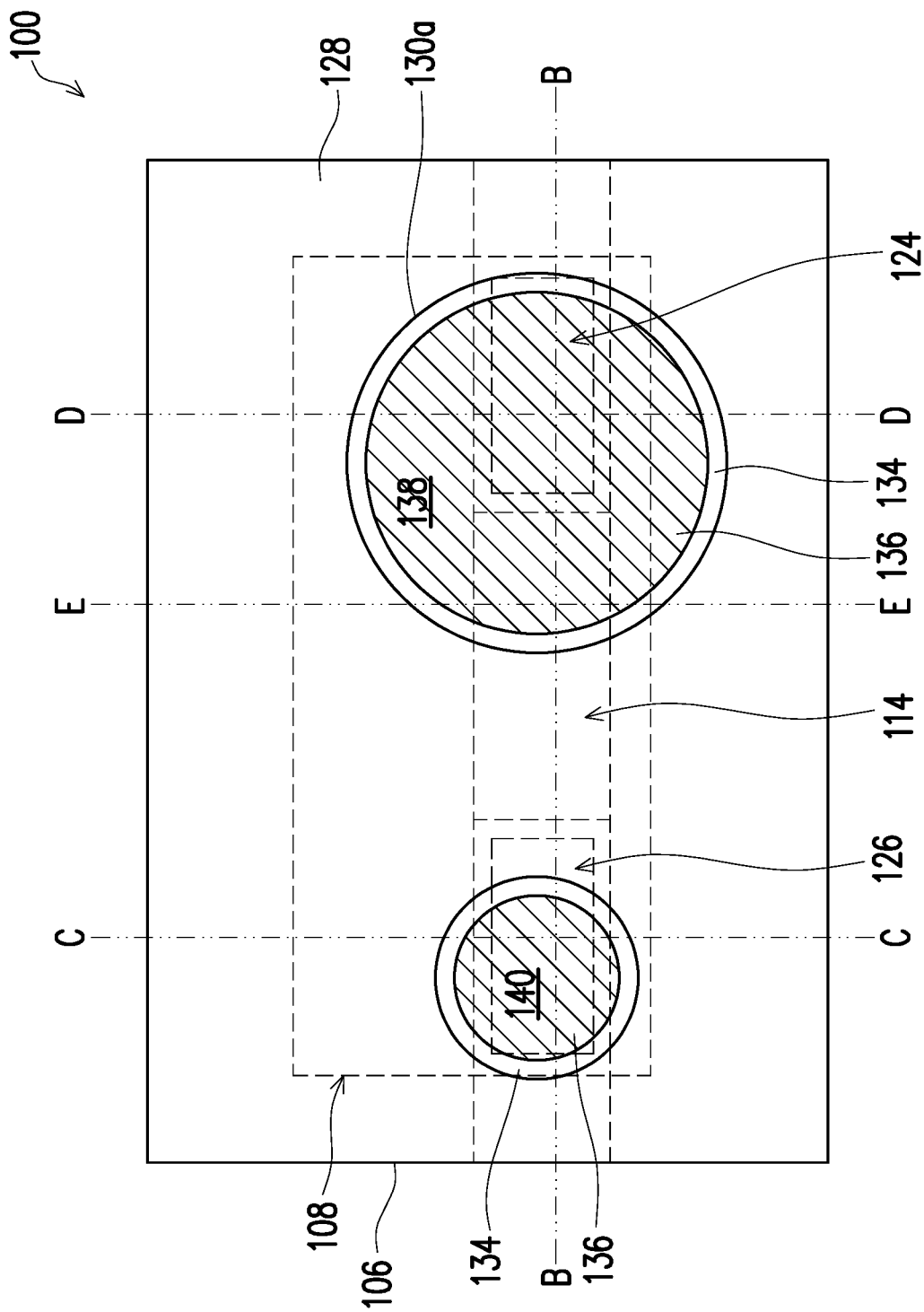
Figure 11B:
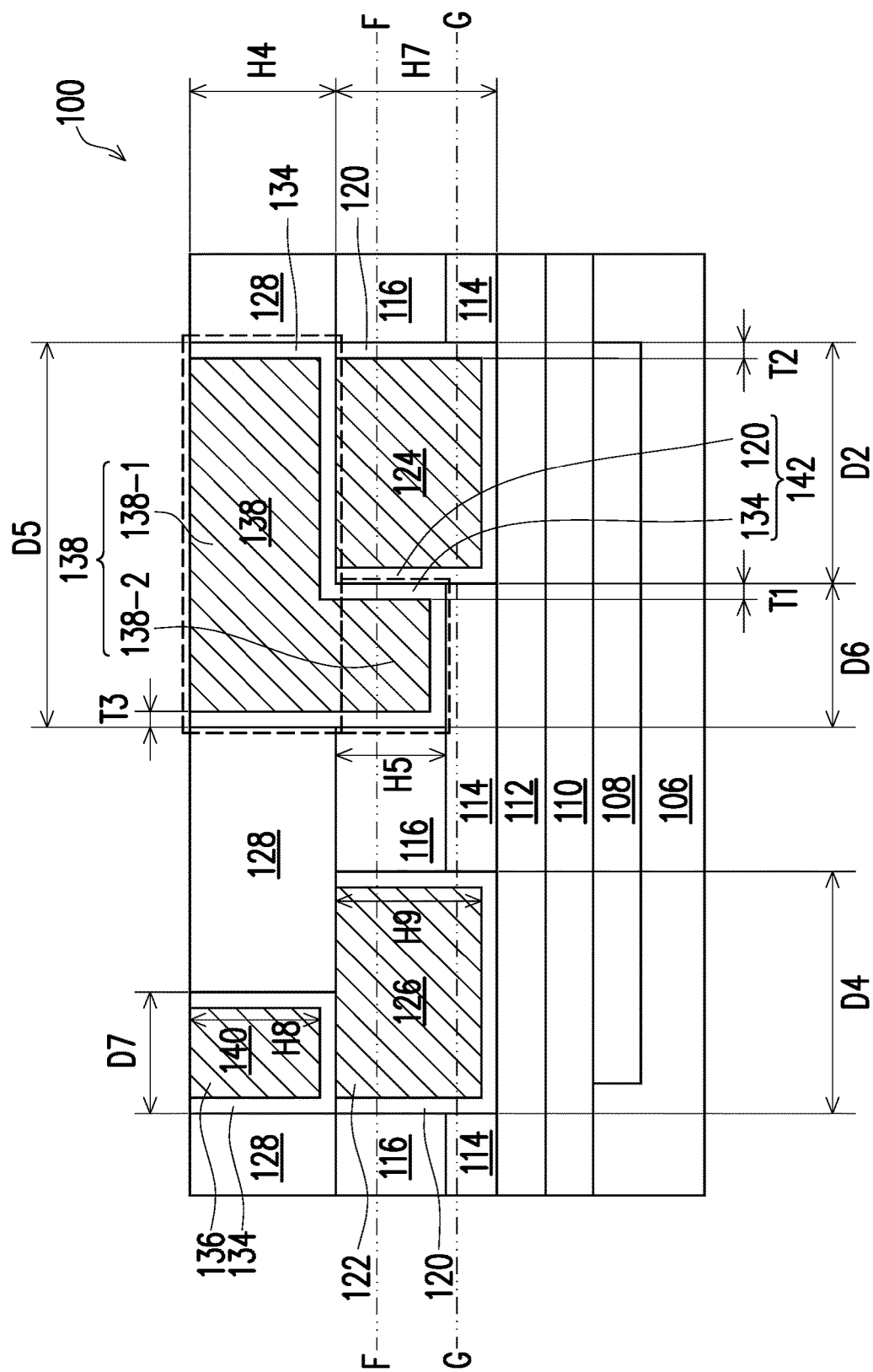
Figure 11C:
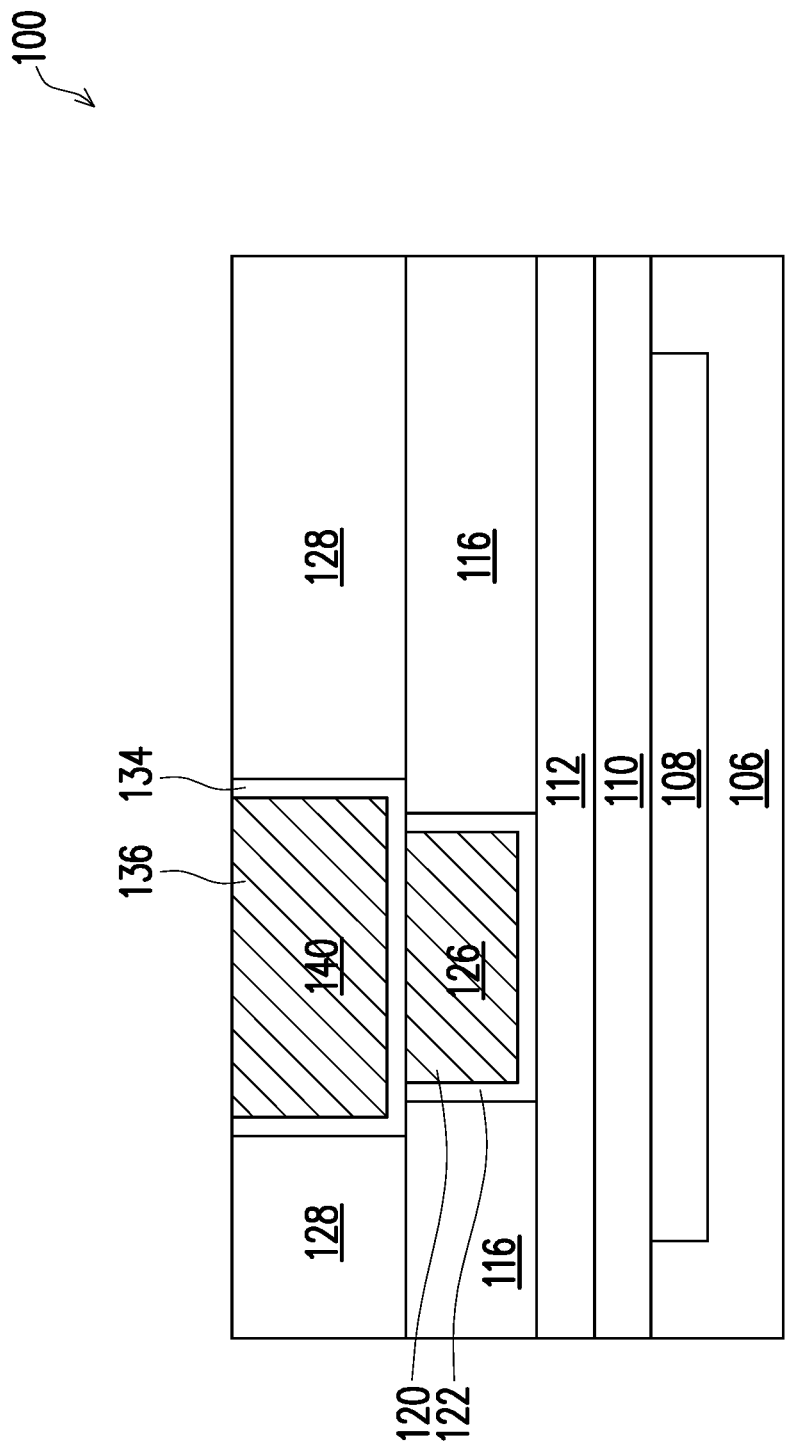
Figure 11D:
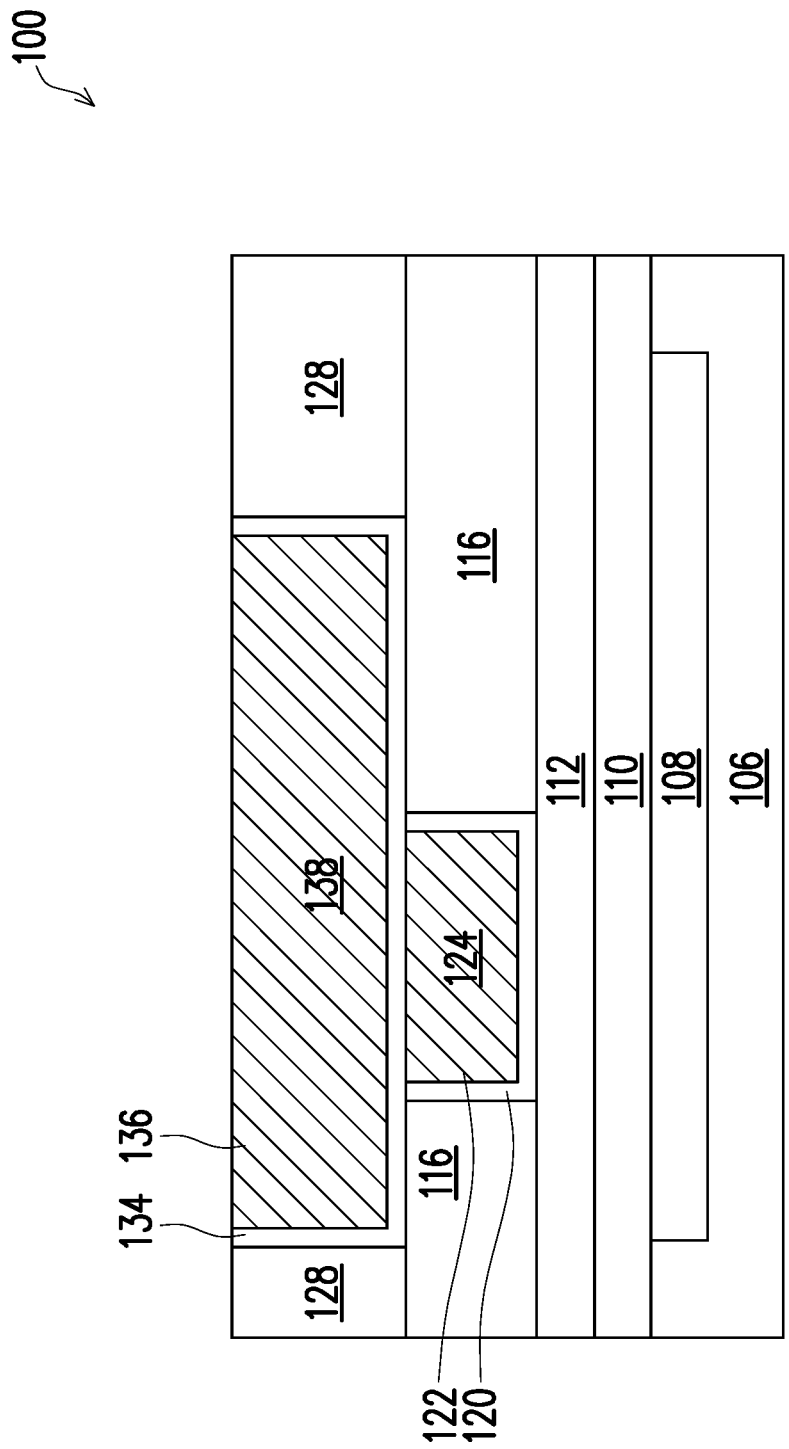
Figure 11E:
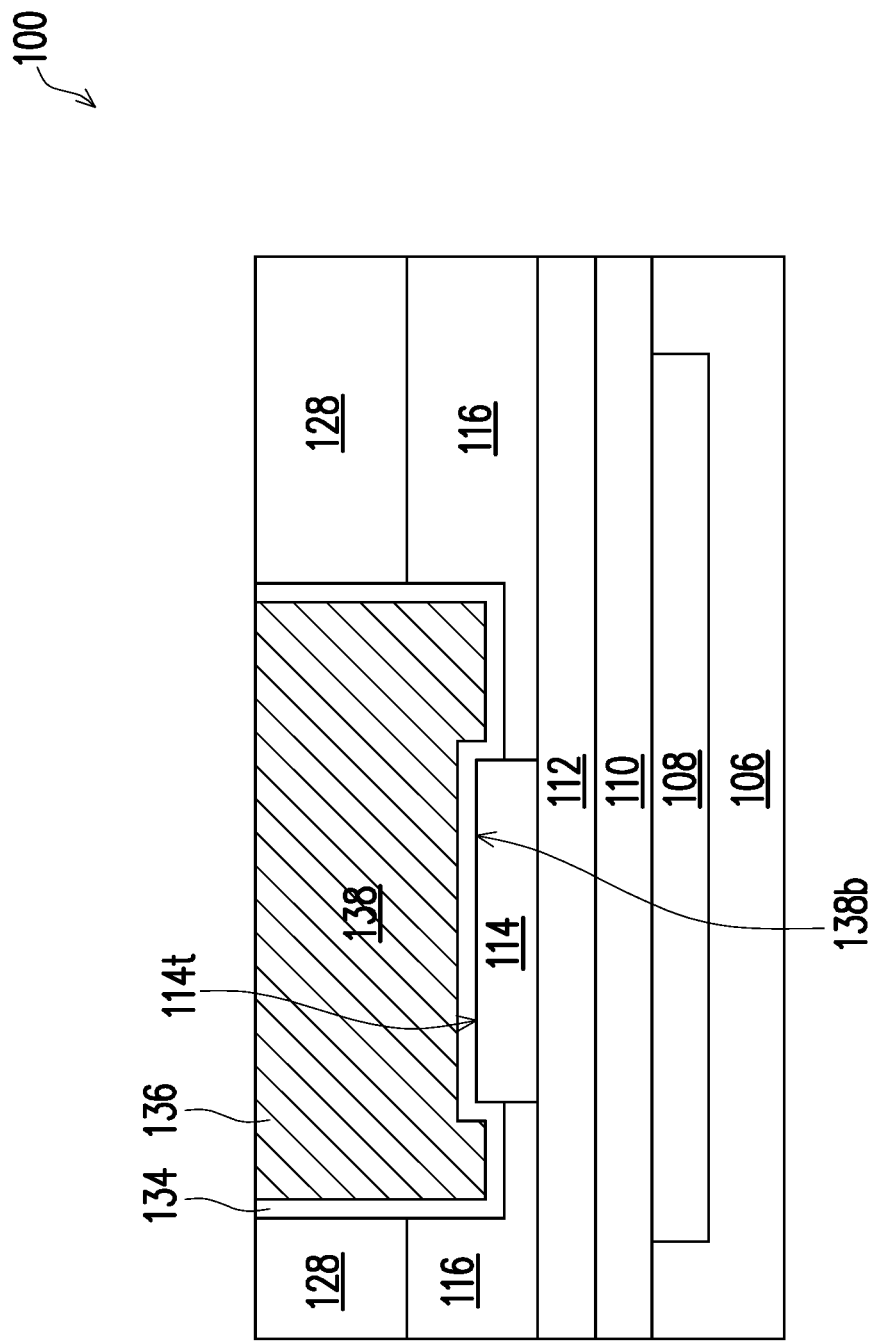
FIG. 11E illustrates a vertical cross-sectional view of the memory device taken along the plane E-E shown in FIG. 11A.

FIG. 11E illustrates a vertical cross-sectional view of the memory device 100 taken along the plane E-E shown in FIG. 11A. As can be seen in FIG. 11E, the source extension 138 expand across the latitudinal direction of the high-K dielectric layer 114. Due to the over-etching of the first ILD 116 during formation of the openings 130a (FIG. 9E) as discussed earlier, the second glue layer 134 is in contact with the top surface and a portion of the sidewall surfaces of the high-K dielectric layer 114. As a result, the bottom 138b of the source extension 138 (e.g., the second glue layer 134 contacting the first ILD 116) is dropped below to an elevation which may be the same or slightly below the top surface 114t of the high-K dielectric layer 114.

Figure 11F:
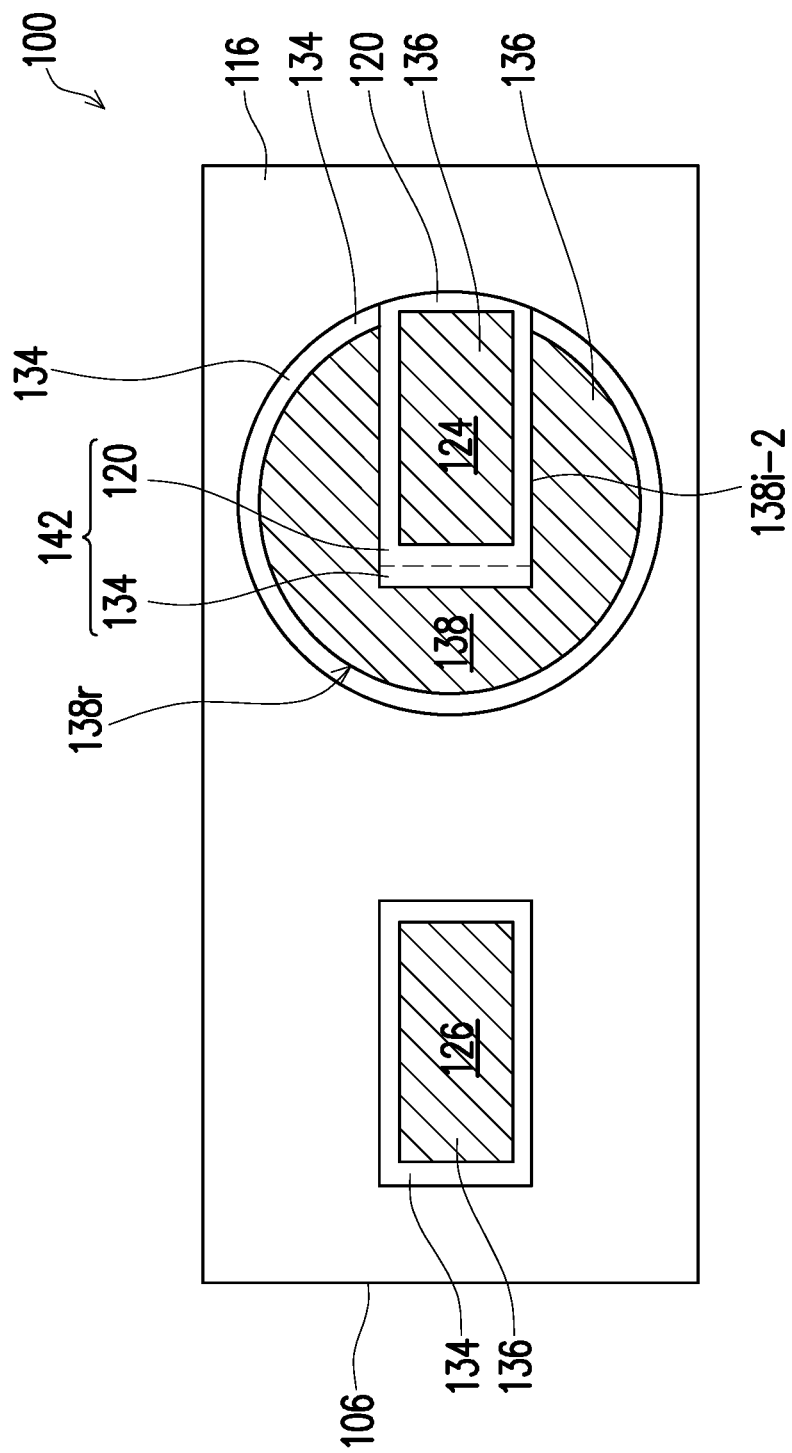
FIGS. 11F and 11G illustrate a horizontal cross-sectional view of the memory device taken along the planes F-F and G-G shown in FIG. 11B, respectively.
Figure 11G:
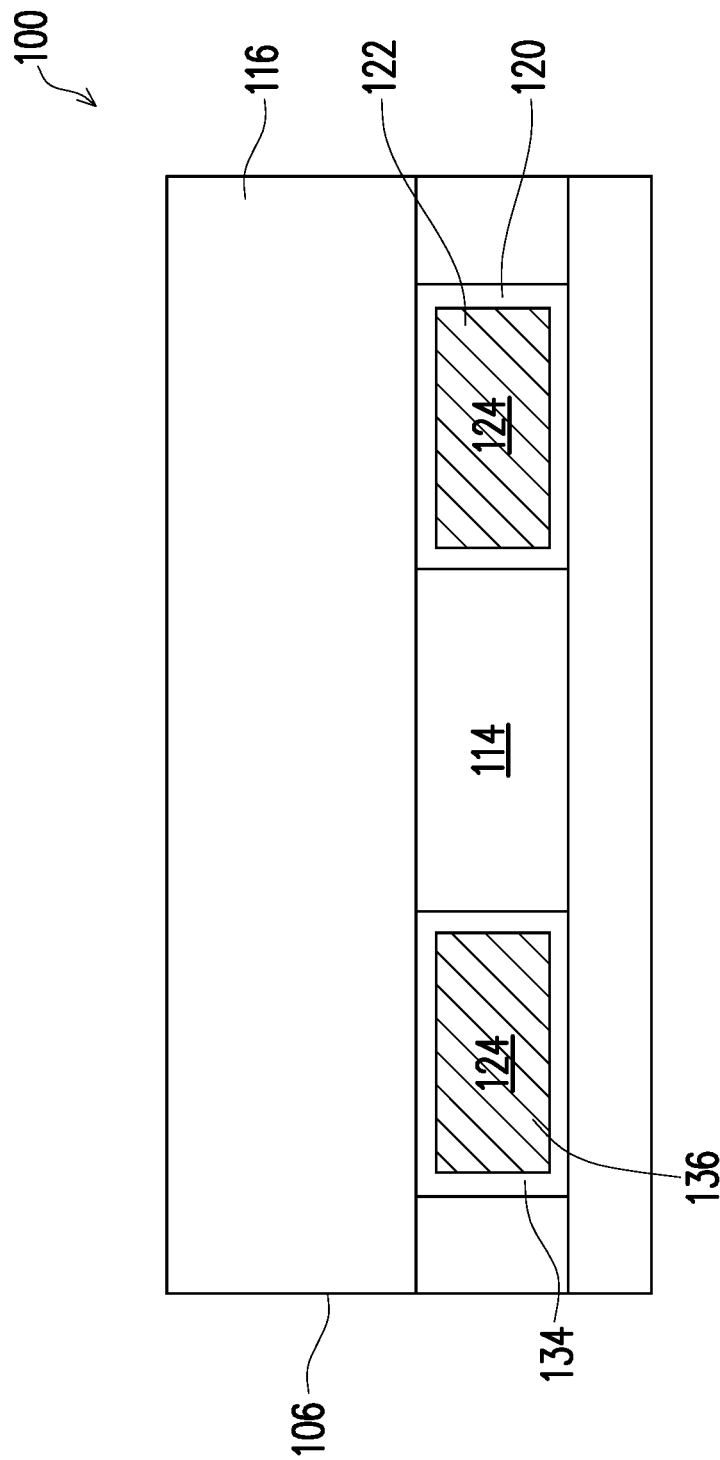

FIGS. 11F and 11G illustrate a horizontal cross-sectional view of the memory device 100 taken along the planes F-F and G-G shown in FIG. 11A, respectively. In FIG. 11F, the source extension 138 (e.g., second portion 138-2) has a round exterior surface 138r. A portion of the source extension 138 has a cut-out 139 extending inwardly from the round exterior surface 138r. The cut-out 139 is defined by a first interior surface 138i-1, a second interior surface 138i-2, and a third interior surface 138i-3 of the source extension 138. The second interior surface 138i-2 opposes the first interior surface 138i-1, and is connected to the first interior surface 138i-1 through the third interior surface 138i-3. The first, second, and third interior surfaces 138i-1, 138i-2, 138i-3 include a substantially straight surface. The first interior surface 138i-1 is parallel to the second interior surface 138i-2. The cut-out 139 is sized to accommodate the source feature 124 so that the source extension 138 surrounds at least three surfaces of a portion of the source feature 124. The first glue layer 120 encompasses the source feature 124 and separates the source feature 124 from the source extension 138. Particularly, a total thickness of the glue layer section 142 (which includes a portion of the first glue layer 120 and a portion of the second glue layer 134) in contact with the third interior surface 138i-3 and the source feature 124 is about twice the thickness of the first glue layer 120 surrounding the other sides of the source feature 124 (or twice the thickness of the second glue layer 134 contacting the exterior surface 138r). In some embodiments, each of a portion of the source extension 138 (e.g., second portion 138-2) and the drain feature 126 intersecting a common plane are surrounded entirely by the first ILD 116. In FIG. 11G, the high-K dielectric layer 114 is shown to cover the boundary of the source feature 124 and the drain feature 126 (including the first and second glue layers 120, 134).

Figure 11H:
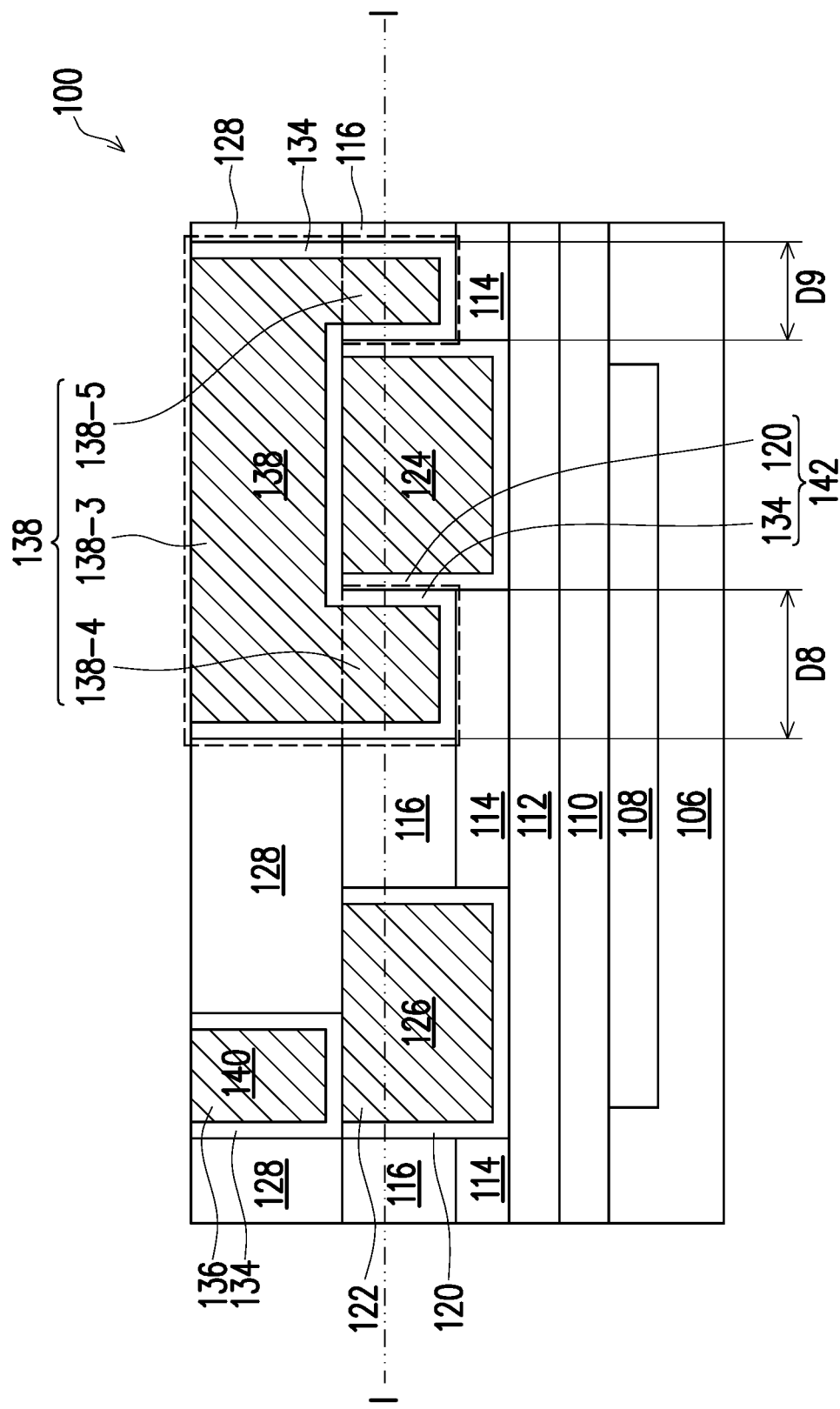
FIG. 11H illustrates a vertical cross-sectional view of the memory device taken along the plane B-B shown in FIG. 11A, in accordance with an alternative embodiment of the present disclosure.
Figure 11I:
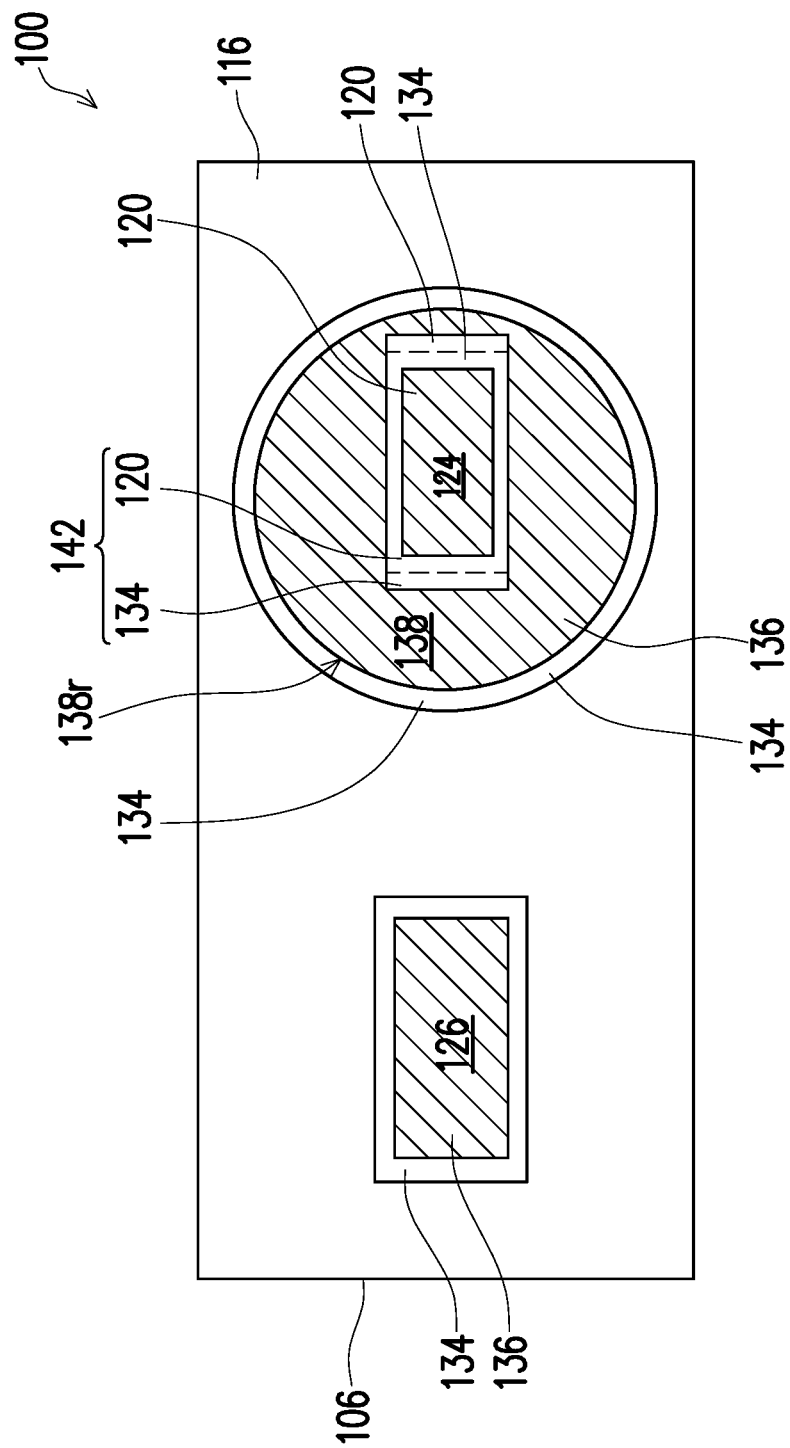
FIG. 11I illustrates a horizontal cross-sectional view of the memory device taken along the planes I-I shown in FIG. 11H.

FIG. 11H illustrates a vertical cross-sectional view of the memory device 100 taken along the plane B-B shown in FIG. 11A, in accordance with an alternative embodiment of the present disclosure. FIG. 11I illustrates a horizontal cross-sectional view of the memory device 100 taken along the planes I-I shown in FIG. 11H. In this embodiment, the source extension 138 at the source feature 124 and the drain extension 140 at the drain feature 126 are size-asymmetric with respect to each other. In FIG. 11H, the source extension 138 may be considered to include a first portion 138-3, a second portion 138-4, a third portion 138-5 (all including the second glue layer 134 and are represented by dotted lines). The second portion 138-4 and the third portion 138-5 integrate with the first portion 138-1 and are extended downwardly from the first portion 138-3 to surround a portion of the source feature 124. In one embodiment, the second portion 138-4 has a dimension D8 and the third portion 138-5 has a dimension D9 that is less than the dimension D8. That is, the second portion 138-4 and the third portion 138-5 are size-asymmetric with respect to each other.

As can be seen in FIGS. 11H and 11I, a portion of the first glue layer 120 and a portion of the second glue layer 134 disposed between the conductive material 122 (of the source feature 124) and the conductive material 136 (of the source extension 138) form a glue layer section 142, and the glue layer section 142 is about twice the thickness of the second glue layer 134 surrounding the exterior surface 138r of the source extension 138. The first glue layer 120 surrounding the source feature 124 and the drain feature 126 have the same uniform thickness. In some embodiments, the second glue layers 134 is formed from a first material (e.g., TiN) and the first glue layer 120 is formed from a second material (e.g., TaN) that is chemically different from the first material. Alternatively, the first and second glue layers 120, 134 are formed of the same material (e.g., TiN). In some embodiments, the source extension 138 and the source feature 124 are non-concentric as shown in FIGS. 11H and 11I. In some embodiments, the source extension 138 and the source feature 124 are configured to be substantially concentric.

Figure 12:
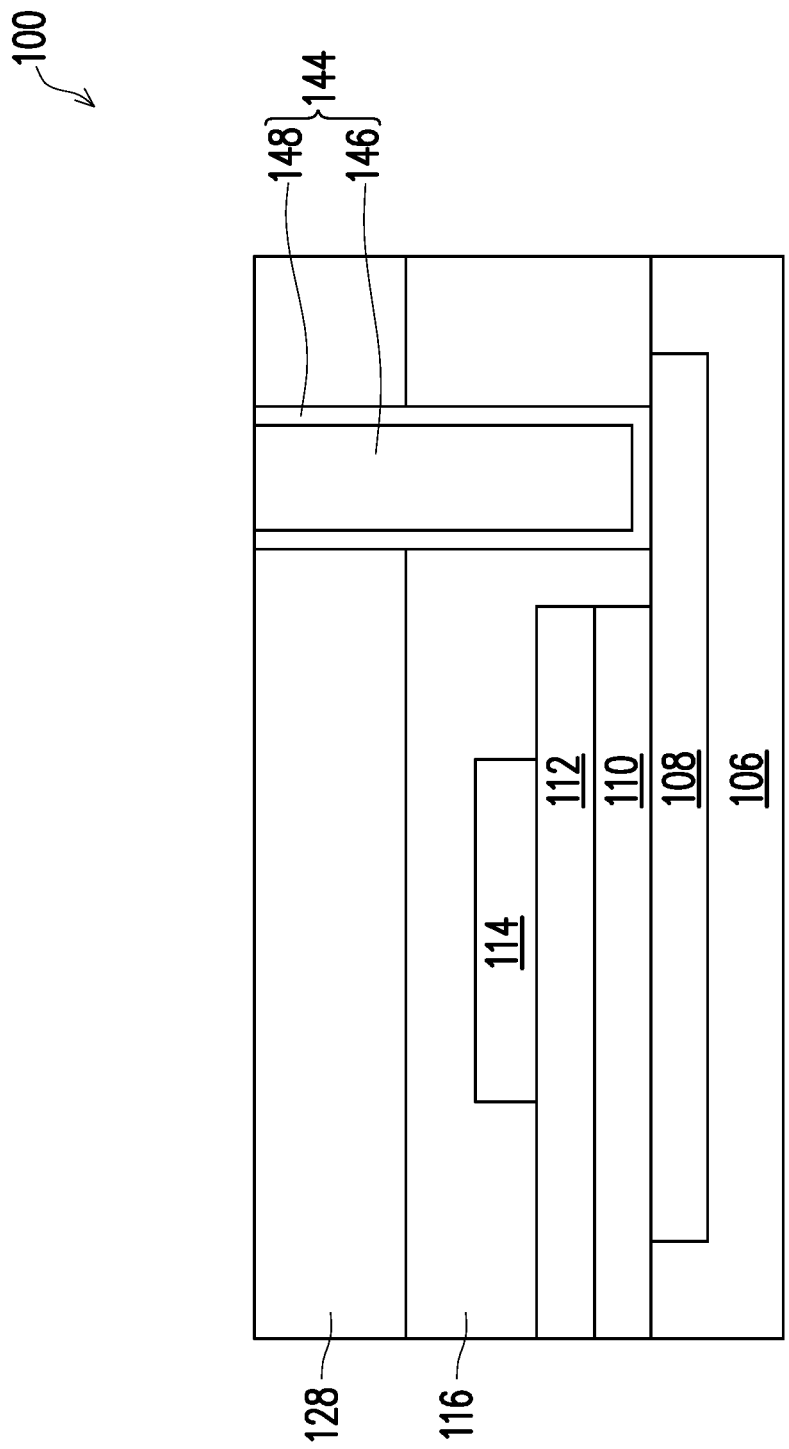
FIG. 12 illustrates a vertical cross-sectional view of a contact via structure connecting to a gate electrode, in accordance with an alternative embodiment of the present disclosure.

While not shown, it is contemplated that the memory device 100 may undergo further processes to form various features contacts/vias, interconnect metal layers, dielectric layers, passivation layers, etc. The source/drain extension 138, 140 are electrically connected to a respective power supply. For example, the source extension 138 can be electrically connected to a negative voltage (VSS) supply (i.e., ground or zero voltage) and the drain extension 140 can be electrically connected to a positive voltage (VDD) supply. A contact via structure may be formed through the second ILD 128 and the first ILD 116 to connect with the gate electrode 108. FIG. 12 illustrates a vertical cross-sectional view of a contact via structure 144 extending through the second ILD 128 and the first ILD 116 to connect with the gate electrode 108, in accordance with an alternative embodiment of the present disclosure. The contact via structure 144 may include a conductive material 146 and a barrier layer 148 disposed between the conductive material 146 and the first and second ILDs 116, 128. The barrier layer 146 may include metal nitride, metal oxide, two-dimensional (2D) material, or a combination thereof. Suitable metals for the barrier layer 310 may include, but are not limited to, Ta, Ti, W, Mn, Zn, In, or Hf. In some embodiments, the barrier layer 310 is a metal nitride, such as TaN, TiN or WN. A positive writing voltage (+1 Vwrite) or a negative reading voltage (−1 Vwrite) can be applied to the gate electrode 108 through the contact via structure 144 to perform program or erase operations.

Figure 13:
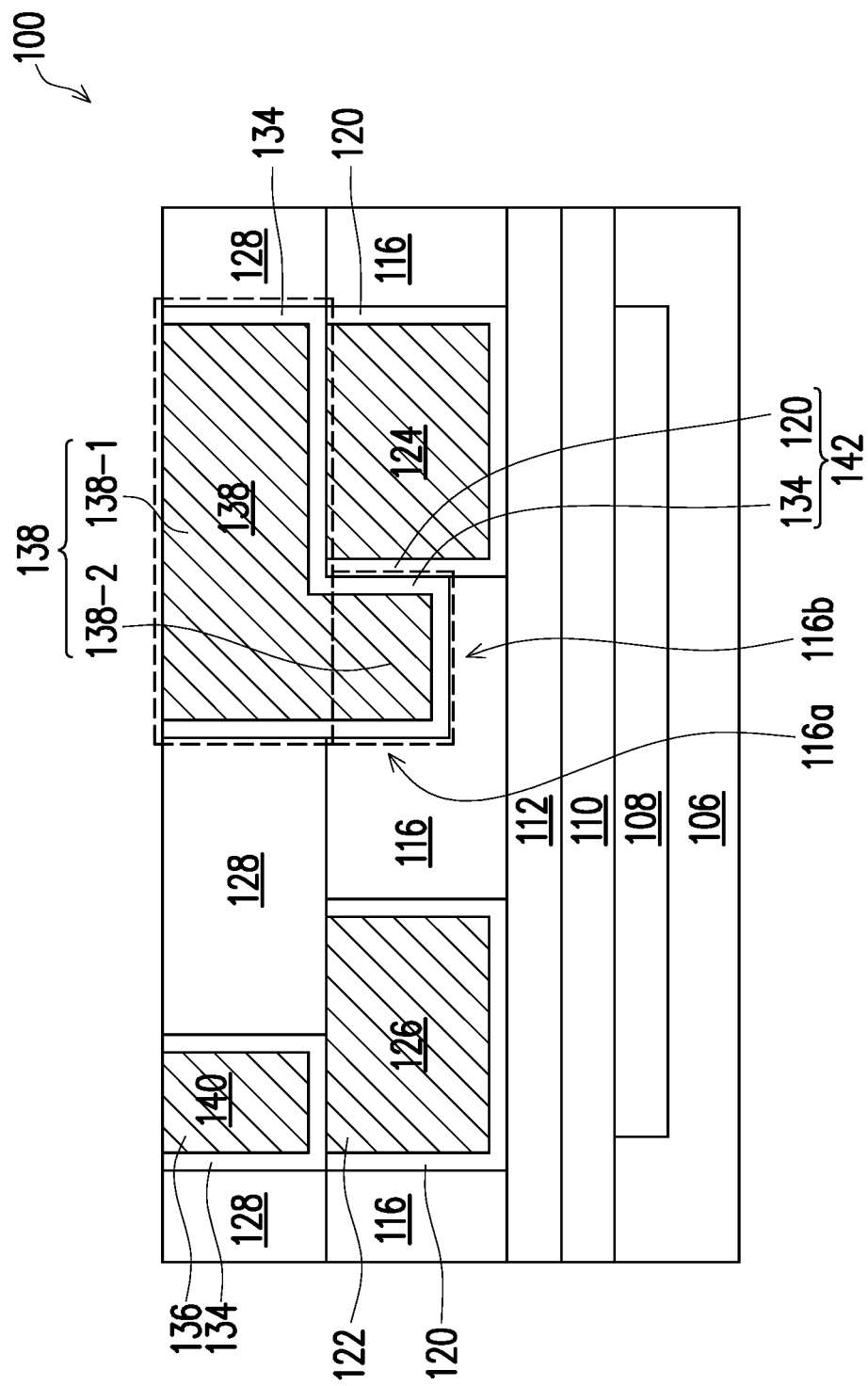
FIGS. 13-15 illustrate a vertical cross-sectional view of a memory device in accordance with some alternative embodiments.

FIG. 13 illustrates a vertical cross-sectional view of the memory device 100 in accordance with some alternative embodiments. The embodiments shown in FIG. 13 is substantially identical to the embodiment shown in FIG. 11B except that the high-K dielectric layer 114 is removed from the embodiment of FIG. 13. In this embodiment, the source extension 138 and the drain extension 140 are also size-asymmetric with respect to each other. The first ILD 116 has a first portion 116a disposed between the drain feature 126 and the second portion (e.g., the second portion 138-2) of the source extension 138, and a second portion 116b extending between the source feature 124 and the drain feature 126. Therefore, the second portion 116b of the first ILD 116 is disposed between the second portion 138-2 of the source extension 138 and the metal oxide semiconductor layer 112. The second portion 138-2 of the source extension 138 help enhance the coupling electric field by shortening the thickness of a portion (e.g., second portion 116b) of the first ILD 116.

Figure 14:
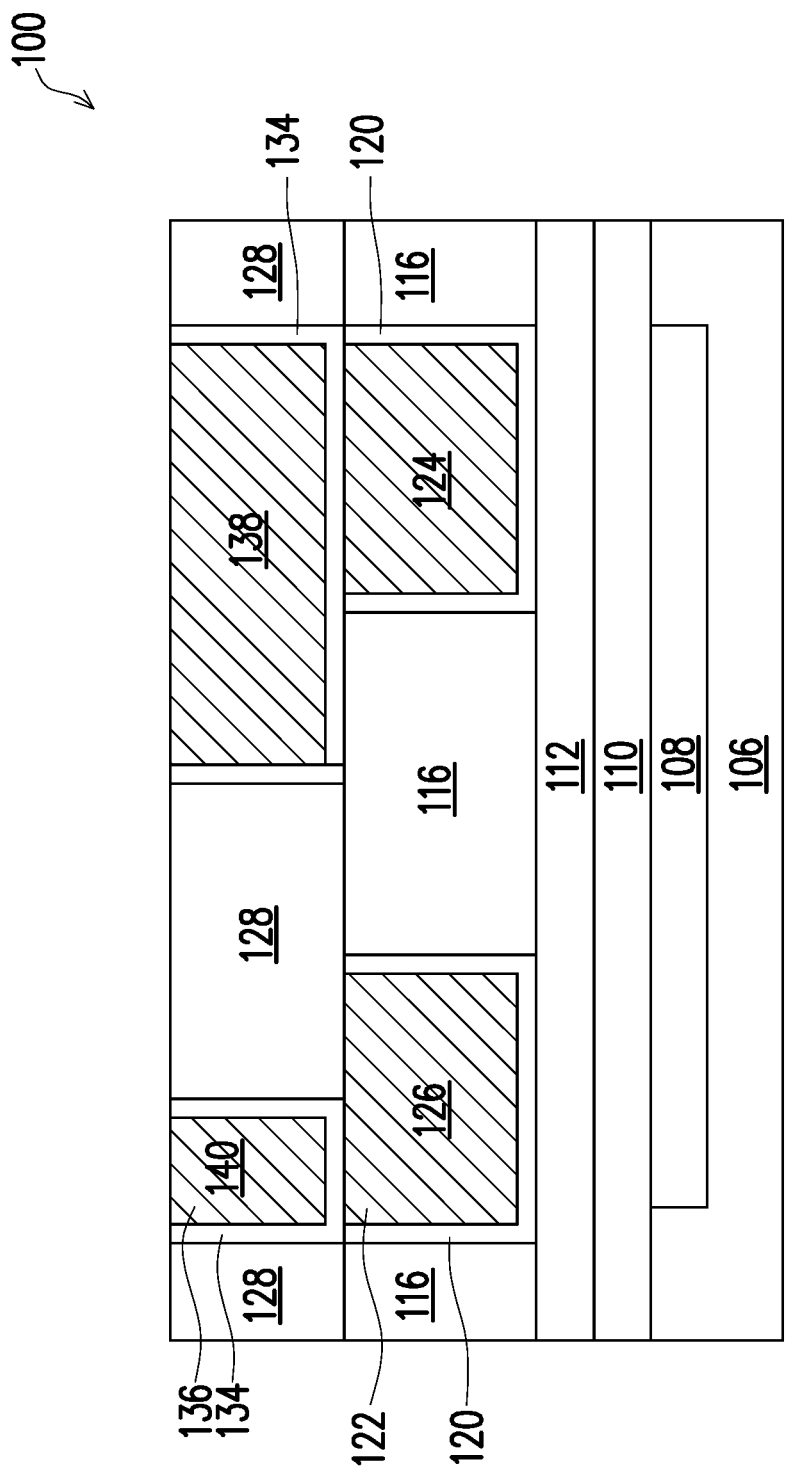

FIG. 14 illustrates a vertical cross-sectional view of the memory device 100 in accordance with some alternative embodiments. The embodiments shown in FIG. 14 is substantially identical to the embodiment shown in FIG. 13 except that a portion of the source extension 138 does not extend downwardly to surround a portion of the source feature 124. In this embodiment, the source extension 138 and the drain extension 140 are still size-asymmetric with respect to each other. However, the first ILD 116 disposed between the source feature 124 and the drain feature 126 is not recessed. In other words, the source extension 138 does not extend below the top surface of the source feature 124. Therefore, the first glue layer 120 contacting sidewalls of each of the source and drain features 124, 126 is fully surrounded by and in contact with the first ILD 116. The asymmetric configuration of the source extension 138 and drain extension 140 helps increasing overlapped region of the source extension 138 and the ferroelectric dielectric layer 110, which in turn, enhances the coupling electric field in the ferroelectric dielectric layer 110 and therefore a wider memory window to promote the erase efficiency during the erase operation.

Figure 15:
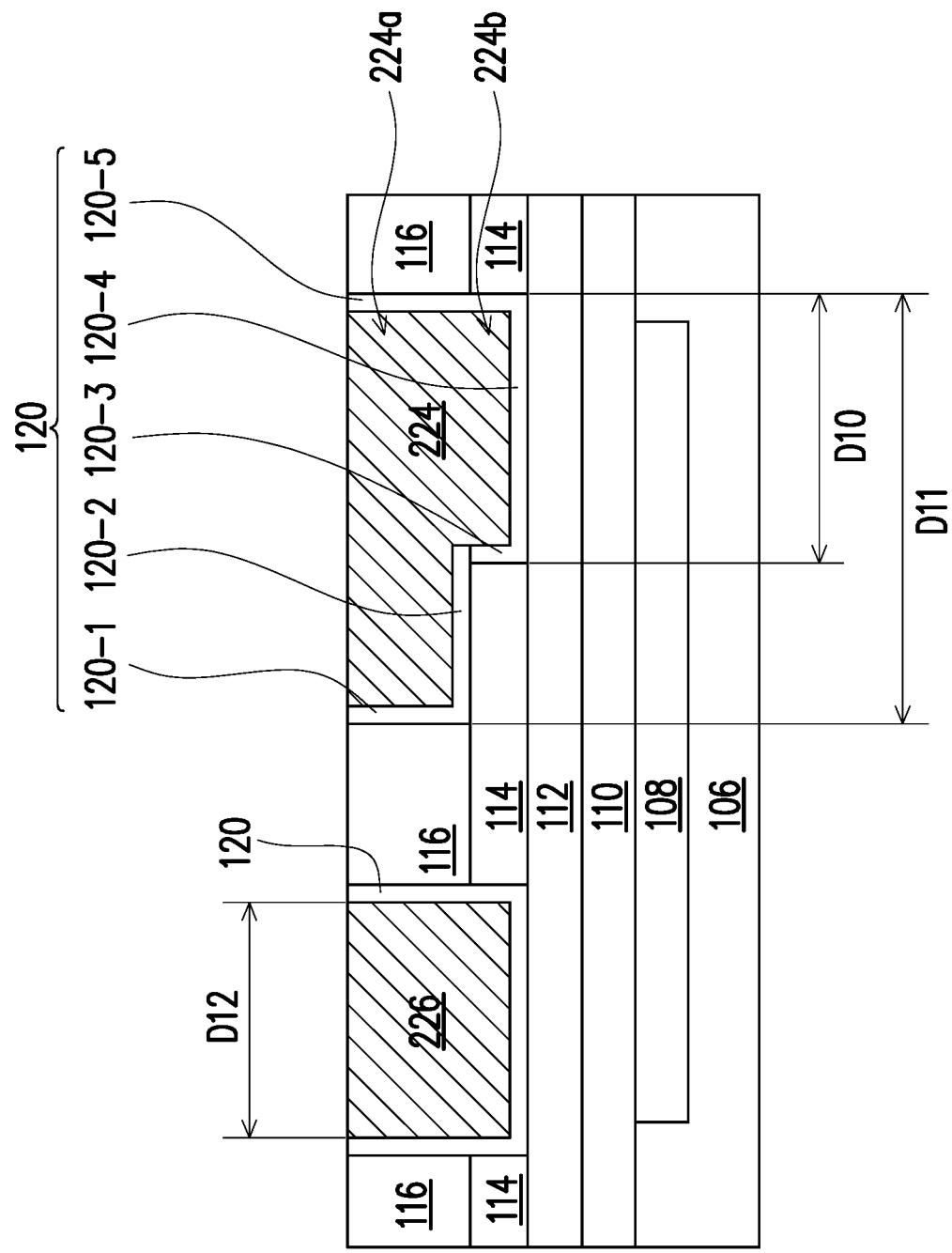

FIG. 15 illustrates a vertical cross-sectional view of the memory device 200 in accordance with some alternative embodiments. In this embodiment, the insulating material layer 106, the gate electrode 108, the ferroelectric dielectric layer 110, the metal oxide semiconductor layer 112, the high-K dielectric layer 114, the first glue layer 120, and the first ILD 116 are substantially identical to the embodiment shown in FIG. 11B. The memory device 200 includes a source feature 224 and a drain feature 226, such as the source/drain features 124, 126 discussed above. The source and drain features 224, 226 are disposed over the metal oxide semiconductor layer 112 and separated from each other by the high-K dielectric layer 114 and the first ILD 116. Unlike the embodiment of FIG. 11B, the source extension and drain extension, such as source/drain extensions 138, 140, are not used. Instead, the source feature 224 is formed to have an asymmetric configuration with respect to the drain feature 226. Specifically, the source feature 224 has a bottom portion 224b having a dimension D10 and an upper portion 224a having a dimension D11 that is greater than the dimension D10. The drain feature 226 has a dimension D12 that is equal to D10 of the bottom portion 224b of the source feature 224. The bottom portion 224b is surrounded by the high-K dielectric layer 114. The upper portion 224a extends laterally and over the top surface of the high-K dielectric layer 114. The asymmetric configuration of the source feature 224 and the drain feature 226 helps increasing overlapped region of the source feature 224 and the ferroelectric dielectric layer 110, which in turn, enhances the coupling electric field in the ferroelectric dielectric layer 110. As a result, a wider memory window is obtained The first glue layer 120 is formed on the sidewalls and bottom surfaces of the source/drain features 224, 226. The first glue layer 120 at the source feature 224 generally includes first, second, third, fourth, and fifth portions 120-1, 120-2, 120-3, 120-4, 120-5, and each of adjacent portions form an angle less than 180 degrees. In one exemplary embodiment, the first portion 120-1 of the first glue layer 120 is disposed between and in contact with the first ILD 116 and the upper portion 224a of the source feature 224. The second portion 120-2 of the first glue layer 120 is disposed between and in contact with the high-K dielectric layer 114 and the upper portion 224a of the source feature 224. The third portion 120-3 of the first glue layer 120 is disposed between and in contact with the high-K dielectric layer 114 and the bottom portion 224b of the source feature 224. The fourth portion 120-4 of the first glue layer 120 is disposed between and in contact with the metal oxide semiconductor layer 112 and the bottom portion 224b of the source feature 224. The fifth portion 120-5 has a first side in contact with the source feature 224 and a second side opposing the first side and in contact with the first ILD 116 and the high-K dielectric layer 114.

Various embodiments of the present disclosure provide a memory device and methods of forming the same. The memory device includes a bottom gate electrode and a ferroelectric dielectric layer disposed over the bottom gate and between a gate electrode and a metal oxide semiconductor layer. A source feature and a drain feature are formed over the metal oxide semiconductor layer. Each of the source and drain features has a metallic extension formed thereon. The metallic extension at the source feature is size-asymmetric with respect to the metallic extension at the drain feature. In some embodiments, a portion of the metal extension at the source feature extends laterally and downwardly to surround at least three sides of a portion of the source feature. The metal extensions at the source feature serve as a source to provide additional hole carriers to the metal oxide semiconductor layer when a negative voltage is applied to the bottom gate electrode, which enhances the coupling electric field in the ferroelectric dielectric layer. As a result, a full polarization switching can be obtained in the ferroelectric dielectric layer during the program and erase operations. An enhanced coupling electric field also leads to a wider memory window and a prominent voltage drop in the ferroelectric dielectric layer, which increases the erase efficiency during the erase operation.

An embodiment is a memory device. The memory device includes a gate electrode disposed in an insulating material layer, a ferroelectric dielectric layer disposed over the gate electrode, a metal oxide semiconductor layer disposed over the ferroelectric dielectric layer, a source feature disposed over the metal oxide semiconductor layer, wherein the source feature has a first dimension, and a source extension. The source extension includes a first portion disposed over the source feature, wherein the first portion has a second dimension that is greater than the first dimension. The source extension also includes a second portion extending downwardly from the first portion to an elevation that is lower than a top surface of the source feature.

Another embodiment is a memory device. The memory device includes a source feature having sidewalls and a bottom surface, a source extension comprising a first portion and a second portion integrated with and over the first portion, wherein the source extension has an exterior surface, a bottom surface, and a cut-out extending inwardly from the exterior surface, and the cut-out surrounds at least three sidewalls of the source feature. The memory device also includes a drain feature disposed adjacent the source extension, the drain feature having sidewalls and a bottom surface.

A further embodiment is a method for forming a memory device. The method includes forming a ferroelectric dielectric layer over a gate electrode, forming a metal oxide semiconductor layer over the ferroelectric dielectric layer, forming a first interlayer dielectric (ILD) over the metal oxide semiconductor layer, forming first openings through the first ILD to expose portions of the metal oxide semiconductor layer, forming sequentially a first glue layer and a first conductive material within the first openings to form a source feature and a drain feature, forming a second ILD over the first ILD, the source feature, and the drain feature, forming a second opening through the second ILD to expose top surfaces of the source feature, the first glue layer, and the first ILD, wherein the second opening has a first dimension, forming a third opening through the second ILD to expose top surfaces of the drain feature and the first glue layer, wherein the third opening has a second dimension that is less than the first dimension, and forming sequentially a second glue layer and a second conductive material within the second and third openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A memory device, comprising:
a gate electrode disposed in an insulating material layer;
a ferroelectric dielectric layer disposed over the gate electrode;
a metal oxide semiconductor layer disposed over the ferroelectric dielectric layer;
a source feature disposed over the metal oxide semiconductor layer, wherein the source feature has a first dimension;
a source extension, comprising:
  a first portion disposed over the source feature, wherein the first portion has a second dimension that is greater than the first dimension; and
  a second portion extending downwardly from the first portion to an elevation that is lower than a top surface of the source feature.

2. The memory device of claim 1, wherein the source feature has a first shape and the source extension has a second shape different from the first shape.

3. The memory device of claim 2, wherein the second portion of the source extension surrounds at least three sides of a portion of the source feature.

4. The memory device of claim 1, further comprising:
a second ILD disposed over the first ILD, wherein the second ILD surrounds the first portion of the source extension.

5. The memory device of claim 4, further comprising:
a third glue layer in contact with sidewalls and a bottom surface of the drain feature; and
a fourth glue layer in contact with sidewalls and a bottom surface of the drain extension.

6. The memory device of claim 5, wherein the first ILD is in contact with the third glue layer, the high-K dielectric layer, the second glue layer, and the second ILD.

7. The memory device of claim 1, further comprising:
a first interlayer dielectric (ILD) surrounding the second portion of the source extension;
a drain feature disposed over the metal oxide semiconductor layer, wherein the drain feature has a third dimension; and
a drain extension disposed over the drain feature, wherein the drain extension has a fourth dimension less than the third dimension.

8. The memory device of claim 2, wherein the first dimension and the third dimension are size-symmetric and the second dimension and the fourth dimension are size-asymmetric.

9. The memory device of claim 2, further comprising:
a high-K dielectric layer disposed over the metal oxide semiconductor layer and between the source feature and the drain feature.

10. The memory device of claim 9, further comprising:
a first glue layer in contact with sidewalls and a bottom surface of the source feature; and
a second glue layer in contact with an exterior surface and bottom surfaces of the first and second portions of the source extension.

11. The memory device of claim 10, wherein the second glue layer is disposed between and in contact with the high-K dielectric layer and the second portion of the source extension.

12. A memory device, comprising:
a source feature having sidewalls and a bottom surface;
a source extension comprising a first portion and a second portion integrated with and over the first portion, wherein the source extension has an exterior surface, a bottom surface, and a cut-out extending inwardly from the exterior surface, and the cut-out surrounds at least three sidewalls of the source feature; and
a drain feature disposed adjacent the source extension, the drain feature having sidewalls and a bottom surface.

13. The memory device of claim 12, wherein the exterior surface has a round shape, and each of the source feature and the drain feature has a quadrilateral shape.

14. The memory device of claim 12, wherein a portion of the second portion overlaps the source feature, and a portion of the second glue layer is disposed between and in contact with the second portion and the top surface of the source feature.

15. The memory device of claim 12, further comprising:
a first glue layer in contact with the sidewalls and the bottom surface of the source feature;
a second glue layer in contact with the exterior surface and the bottom surface of the first portion;
a third glue layer in contact with the sidewalls and the bottom surface of the drain feature;
a high-K dielectric layer disposed between and in contact with the first glue layer and the third glue layer; and
a first interlayer dielectric (ILD) disposed on the high-K dielectric layer, wherein the first ILD is disposed between and in contact with the second glue layer and the third glue layer.

16. The memory device of claim 15, further comprising:
a gate electrode disposed within an insulating material layer;
a ferroelectric dielectric layer in contact with the gate electrode; and
a metal oxide semiconductor layer, comprising:
  a first surface in contact with the high-K dielectric layer, a portion of the first glue layer, and a portion of the third glue layer; and
  a second surface opposing the first surface and in contact with the ferroelectric dielectric layer.

17. The memory device of claim 15, wherein the source extension further comprises:
a first interior surface;
a second interior surface opposing the first interior surface; and
a third interior surface connecting the first interior surface to the second interior surface, wherein the first, second, and third interior surfaces define the cut-out, and a total thickness of a portion of the second glue layer contacting the third interior surface and a portion of the first glue layer is about twice the thickness of the second glue layer contacting the exterior surface of the source extension.

18. The memory device of claim 17, further comprising:
a drain extension disposed over the drain feature; and
a fourth glue layer in contact with the sidewalls and a bottom surface of the drain extension.

19. A method for forming a memory device, comprising:
forming a ferroelectric dielectric layer over a gate electrode;
forming a metal oxide semiconductor layer over the ferroelectric dielectric layer;
forming a first interlayer dielectric (ILD) over the metal oxide semiconductor layer;
forming first openings through the first ILD to expose portions of the metal oxide semiconductor layer;
forming sequentially a first glue layer and a first conductive material within the first openings to form a source feature and a drain feature;
forming a second ILD over the first ILD, the source feature, and the drain feature;
forming a second opening through the second ILD to expose top surfaces of the source feature, the first glue layer, and the first ILD, wherein the second opening has a first dimension;
forming a third opening through the second ILD to expose top surfaces of the drain feature and the first glue layer, wherein the third opening has a second dimension that is less than the first dimension; and
forming sequentially a second glue layer and a second conductive material within the second and third openings.

20. The method of claim 19, further comprising:
prior to forming the first ILD, forming a high-K dielectric layer over the metal oxide semiconductor layer; and
extending the second opening through the first ILD to expose a top surface of the high-K dielectric layer.

\* \* \* \* \*